(12) United States Patent
Kawamura et al.

(10) Patent No.: US 7,737,517 B2
(45) Date of Patent: Jun. 15, 2010

(54) DISPLAY DEVICE

(75) Inventors: Tetsufumi Kawamura, Kokubunji (JP); Takeshi Sato, Kokubunji (JP); Mutsuko Hatano, Kokubunji (JP)

(73) Assignee: Hitachi Displays, Ltd., Mobara-shi (JP)

( * ) Notice: Subject to any disclaimer, the term of this patent is extended or adjusted under 35 U.S.C. 154(b) by 0 days.

(21) Appl. No.: 12/253,257

(22) Filed: Oct. 17, 2008

(65) Prior Publication Data
US 2009/0101895 A1    Apr. 23, 2009

(30) Foreign Application Priority Data
Oct. 19, 2007    (JP) .............................. 2007-272084

(51) Int. Cl.
*H01L 31/0232* (2006.01)
*H01L 31/103* (2006.01)
(52) U.S. Cl. ............... 257/432; 257/440; 257/E21.128; 257/E31.057
(58) Field of Classification Search .................... 257/43, 257/432, 440, E31.128, E31.057
See application file for complete search history.

(56) References Cited

U.S. PATENT DOCUMENTS 6,518,676 B2 * 2/2003 Chikama et al. ............. 257/775
2005/0275038 A1 * 12/2005 Shih et al. .................... 257/382

FOREIGN PATENT DOCUMENTS

JP       2004-349583       12/2004

* cited by examiner

*Primary Examiner*—Ngan Ngo
*Assistant Examiner*—Benjamin Tzu-Hung Liu
(74) *Attorney, Agent, or Firm*—Antonelli, Terry, Stout & Kraus, LLP.

(57) ABSTRACT

A display device includes a pixel including: a gate line; a gate insulating film; a substrate; a data line; a pixel electrode; a semiconductor layer formed on the gate line and the gate insulating film; a protective film formed on the data line, the pixel electrode, and the semiconductor layer; and a thin film transistor. A portion of the gate line also serves as a gate electrode of the thin film transistor. A portion of the data line also serves as a drain electrode of the thin film transistor. A portion of the pixel electrode also serves as a source electrode of the thin film transistor. The semiconductor layer is formed of an oxide semiconductor layer. The oxide semiconductor layer is directly connected to the drain electrode and the source electrode, and the data line and the pixel electrode are formed of different conductive films.

21 Claims, 19 Drawing Sheets

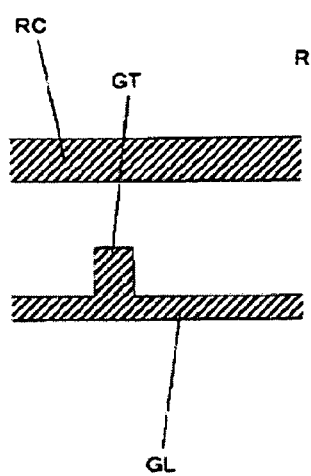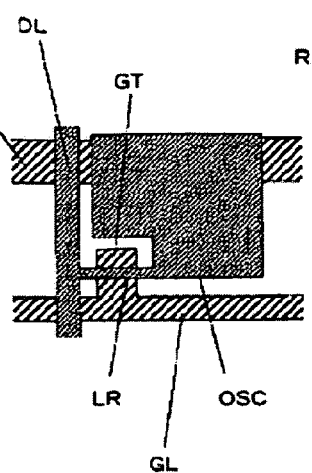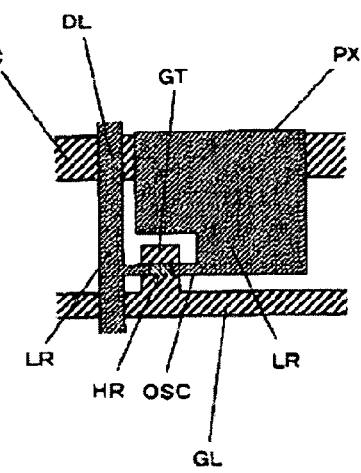

DISPLAY DEVICE

CROSS-REFERENCE TO RELATED APPLICATION

The present application claims priority from Japanese application JP 2007-272084 filed on Oct. 19, 2007, the content of which is hereby incorporated by reference into this application.

BACKGROUND OF THE INVENTION

1. Field of the Invention

The present invention relates to a display device, and particularly, to a display device including a thin film transistor in each pixel.

2. Description of the Related Art

For example, in a liquid crystal display device of an active matrix type, substrates are disposed so as to be opposed via liquid crystal, and gate lines extending in an x direction are disposed in parallel in a y direction and data lines extending in the y direction are disposed in parallel in the x direction on a surface of one of the substrates on a liquid crystal side. Further, a region surrounded by the gate lines and the data lines serves as a pixel region, and the pixel region includes at least the thin film transistor to be turned on by a signal (scanning signal) from the gate line and a pixel electrode to which a video signal from the data line is supplied via the turned-on thin film transistor.

In this case, the thin film transistor, the gate line, the data line, the pixel electrode, and the like are formed by stacking a conductive layer, a semiconductor layer, an insulating film, and the like processed into desired patterns using selective etching by a photolithography technology on a substrate in a desired order.

The display device thus configured is required to reduce the number of laminated films and to reduce the number of processes for selective etching by the photolithography technology in order to achieve flexibility and reduce costs.

In response to those demands, for example, there is known a technology in which an oxide semiconductor layer is used as a semiconductor layer which forms a channel of a thin film transistor, and the data line and the pixel electrode which are each formed of a conductive film are directly connected to the oxide semiconductor layer.

Such a display device described above is disclosed in, for example, JP 2004-349583 A.

However, in the display device described in JP 2004-349583 A, the data line and the pixel electrode are formed of the same conductive film. Thus, for example, in a case where the data line and the pixel electrode are formed of a transparent conductive film such as Indium Tin Oxide (ITO), the display device inevitably has high electric resistance in the data line.

Further, in a case where an opaque conductive film made of metal or the like is used as the conductive film, there is a disadvantage in that the opaque conductive film cannot be applied to a transmissive liquid crystal display device using a backlight.

SUMMARY OF THE INVENTION

An object of the present invention is to provide a display device having a structure capable of reducing the number of laminated films and the number of manufacturing processes.

Further, another object of the present invention is to provide a display device in which an aperture ratio of a pixel is configured to increase.

The outlines of representative aspects of the present invention disclosed in the subject application are briefly described as follows.

(1) A display device according to the present invention includes, for example:
a gate line;
a gate insulating film;
a substrate on which the gate line and the gate insulating film are sequentially formed;
a data line formed on the gate insulating film;
a pixel electrode formed on the gate insulating film;
a semiconductor layer formed on the gate insulating film over a gate electrode;
a protective film formed on the data line, the pixel electrode, and the semiconductor layer; and
a thin film transistor,
a portion of the gate line also serving as a gate electrode of the thin film transistor,
a portion of the data line also serving as a drain electrode of the thin film transistor,
a portion of the pixel electrode also serving as a source electrode of the thin film transistor,
the semiconductor layer being formed of an oxide semiconductor layer,
in which the oxide semiconductor layer is directly connected to the drain electrode and the source electrode, and the data line and the pixel electrode are formed of different conductive films.

(2) In the display device according to the present invention, based on the configuration of (1), the oxide semiconductor layer is, for example, formed on the drain electrode and the source electrode.

(3) In the display device according to the present invention, based on the configuration of (1), the oxide semiconductor layer is, for example, formed on one of the drain electrode and the source electrode, and another one of the drain electrode and the source electrode is formed on the oxide semiconductor layer.

(4) In the display device according to the present invention, based on the configuration of (1), the drain electrode and the source electrode are, for example, formed on the oxide semiconductor layer.

(5) In the display device according to the present invention, based on the configuration of (1), the data line is, for example, formed of one of metal, a laminated film of metal and another conductive film, and a laminated film of metal and a semiconductor film, and the pixel electrode is formed of a transparent conductive film.

(6) In the display device according to the present invention, based on the configuration of (1), at least one of the drain electrode and the source electrode overlaps, for example, the gate electrode in plan view.

(7) A display device according to the present invention includes, for example:
a gate line;
a gate insulating film;
a substrate on which the gate line and the gate insulating film are sequentially formed;
a data line formed on the gate insulating film;
a semiconductor layer formed on the gate insulating film over a gate electrode;
a protective film formed on the gate insulating film, the data line, and the semiconductor layer;
a thin film transistor; and a pixel electrode formed on the protective film, the pixel electrode being connected to a source of the thin film transistor via a through hole formed in the protective film, a portion of the gate line also serving as a gate electrode of the thin film transistor, a portion of the data line also serving as a drain electrode of the thin film transistor, a portion of the pixel electrode also serving as a source electrode of the thin film transistor, the semiconductor layer being formed of an oxide semiconductor layer, in which the semiconductor layer is directly connected to the drain electrode and the source electrode.

(8) In the display device according to the present invention, based on the configuration of (7), the oxide semiconductor layer is, for example, formed on the drain electrode, and the protective film is formed on the drain electrode and the oxide semiconductor layer.

(9) In the display device according to the present invention, based on the configuration of (7), the drain electrode is, for example, formed on the oxide semiconductor layer, and the protective film is formed on the oxide semiconductor layer and the drain electrode.

(10) In the display device according to the present invention, based on the configuration of (7), for example, the protective film is formed on the oxide semiconductor layer, the data line is formed on the protective film, the data line being connected to a drain of the thin film transistor via another through hole formed in the protective film, and the pixel electrode is formed on the protective film, the pixel electrode being connected to the source of the thin film transistor via the through hole formed in the protective film.

(11) In the display device according to the present invention, based on the configuration of (10), the data line and the pixel electrode are, for example, formed of the same conductive film.

(12) In the display device according to the present invention, based on the configuration of (7), for example, the data line is formed of one of metal, a laminated film of metal and another conductive film, and a laminated film of metal and a semiconductor film, and the pixel electrode comprises a transparent conductive film.

(13) In the display device according to the present invention, based on the configuration of (7), the gate electrode and at least one of the drain electrode and the source electrode, for example, overlap with each other.

(14) In the display device according to the present invention, based on the configuration of (1) or (7), for example, a part of a region of the oxide semiconductor layer is modified to have low resistance, and at least one of the data line and the pixel electrode is connected to the part of the region modified to have low resistance.

(15) A display device according to the present invention includes, for example:

a gate line;

a gate insulating film;

a substrate on which the gate line and the gate insulating film are sequentially formed;

a data line formed on the gate insulating film;

a pixel electrode formed on the gate insulating film;

a semiconductor layer formed on the gate insulating film;

a protective layer formed on the data line, the pixel electrode, and the semiconductor layer; and a thin film transistor, a portion of the gate line also serving as a gate electrode of the thin film transistor, a portion of the data line also serving as a drain electrode of the thin film transistor, a portion of the pixel electrode also serving as a source electrode of the thin film transistor, the semiconductor layer being formed of an oxide semiconductor layer, in which a part of a region of the oxide semiconductor layer is modified to have low resistance to integrally form at least one of the data line and the pixel electrode with the part of the region modified to have low resistance.

(16) In the display device according to the present invention, based on the configuration of (15), for example, the data line is formed of the part of the region of the oxide semiconductor layer modified to have low resistance, and the protective film is formed on the oxide semiconductor layer; and the pixel electrode is formed on the protective film, the pixel electrode being connected to a source of the thin film transistor via a through hole formed in the protective film.

(17) In the display device according to the present invention, based on the configuration of (15), for example, the drain electrode is formed to overlap the gate electrode, the oxide semiconductor layer is formed on the drain electrode, and a part of a region of the oxide semiconductor layer is made to have low resistance to form the pixel electrode.

(18) The display device according to the present invention, based on the configuration of (1), (7), or (15), further includes, for example, a comb-shaped pixel electrode disposed to overlap a flat-plate like counter electrode via an insulating film, in which the flat-plate like counter electrode is supplied with a voltage signal serving as a reference with respect to a video signal supplied to the comb-shaped pixel electrode via a common line.

Note that the present invention is not limited to the above-mentioned structures, and various modifications and alterations can be made without departing from the technical idea of the present invention.

In the display device thus configured, the number of laminated films and manufacturing processes can be reduced.

Further, in the display device thus configured, the aperture ratio of the pixel can be improved.

BRIEF DESCRIPTION OF THE DRAWINGS

In the accompanying drawings:

FIGS. 18A to 18C are process drawings illustrating a manufacturing method for a display device according to the another embodiment of the present invention, which illustrate a process for the pixel of FIGS. 17A and 17B;

DETAILED DESCRIPTION OF THE INVENTION

Hereinafter, embodiments of a display device and a manufacturing method for the same according to the present invention are described with reference to the drawings.

First Embodiment

General Configuration

Figure 2:
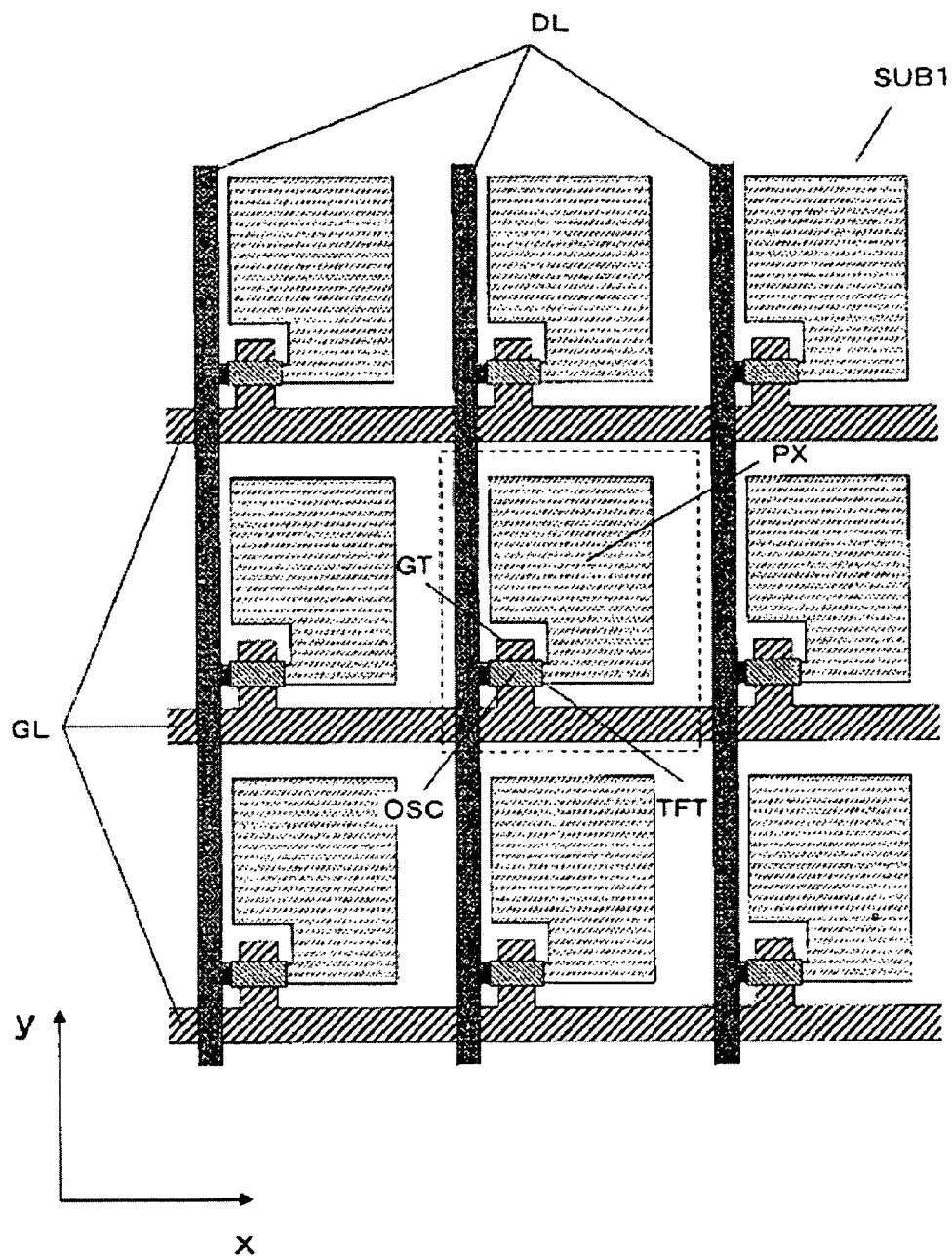
FIG. 2 is a configuration diagram illustrating a circuit which is formed in a liquid crystal display region of a liquid crystal display device exemplified as the display device according to the embodiment of the present invention.

FIG. 2 is a configuration diagram illustrating a circuit according to an embodiment of the present invention, which is formed in a liquid crystal display region of a surface on a liquid crystal side of one substrate SUB1 of substrates disposed to be opposed to each other via liquid crystal of a liquid crystal display device.

In FIG. 2, data lines DL extending in a y direction and disposed in parallel in an x direction and gate lines GL isolated from the data lines DL, extending in the x direction, and disposed in parallel in the y direction are provided. A rectangular region surrounded by those signal lines corresponds to a region of a pixel (illustrated by a dotted frame in FIG. 2). Accordingly, each of the pixels is disposed in matrix, and the liquid crystal display region is configured by the pixel group.

A pixel electrode PX formed of, for example, a transparent electrode is formed across most of each pixel region, and the pixel electrode PX is connected to, for example, the data line DL adjacent on the left side in FIG. 2 via a thin film transistor TFT. By on/off driving of the thin film transistor TFT, supplying and non-supplying of the signal sent from the data line DL to the pixel electrode PX are controlled.

The thin film transistor TFT is formed to have, for example, a structure in which a gate electrode GT formed of an extended portion of the gate line GL is disposed below the semiconductor layer (in this embodiment, an oxide semiconductor layer OSC is used), that is, a so-called bottom-gate type metal insulator semiconductor (MIS) structure.

Accordingly, by sequentially supplying a signal (scanning signal) to each of the gate lines GL, the thin film transistor TFT of each pixel of a pixel column are turned on, and by supplying a video signal to each of the data lines DL in accordance with the turning-on timing, a voltage of the video signal is applied to the pixel electrode PX in each pixel of the pixel column.

The liquid crystal display device illustrated in this embodiment has another substrate (not shown) disposed to be opposed to the substrate SUB1 via the liquid crystal, and a counter electrode common to each pixel is formed on the surface on the liquid crystal side of this substrate. This counter electrode is formed of, for example, a transparent electrode, and a signal including a voltage to be a reference for the signal (video signal) supplied to the data line DL is supplied to the counter electrode.

An electric field generated by a difference in potential between the pixel electrode PX and the counter electrode is applied to the liquid crystal, and in response to the applied electric field, the molecules of the liquid crystal are oriented.

Further, though not shown in FIG. 2, there may be provided a retention capacitor line (denoted as reference symbol RC below) which is isolated from the data line DL and extends in parallel to the gate line GL for each pixel row according to the detailed description of the pixel and the descriptions of other embodiments of the present invention. For example, the retention capacitor line RC is formed in the same layer as the gate line GL (gate electrode GT).

[Configuration of Pixel]

Figure 1A:
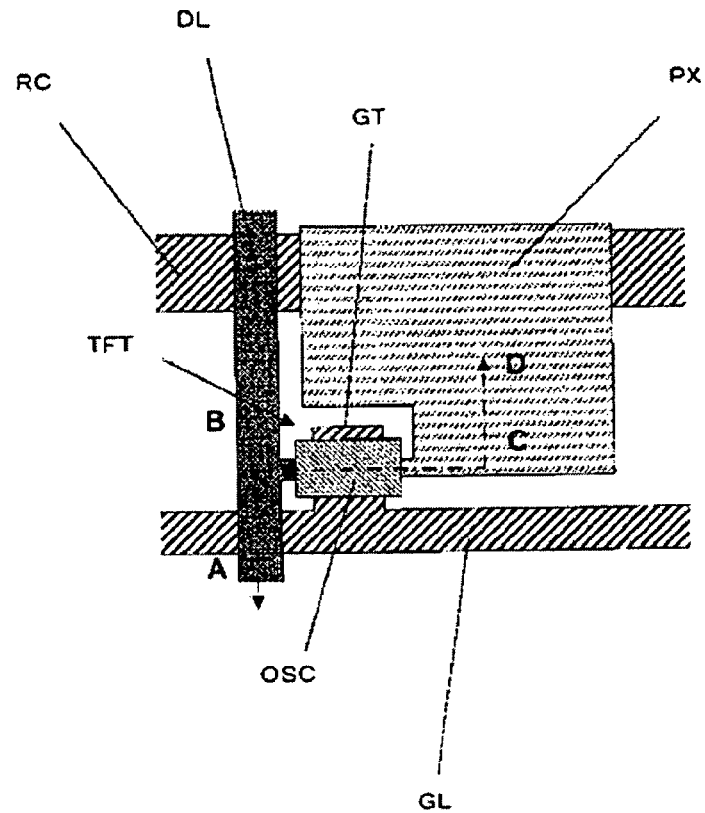
FIGS. 1A and 1B are diagrams illustrating a configuration of a pixel of a display device according to an embodiment of the present invention.

FIG. 1A is a diagram illustrating one pixel extracted form the pixels illustrated in FIG. 2. Further, FIG. 1B is a cross sectional view taken along the line A-B-C-D of FIG. 1A.

Figure 1B:
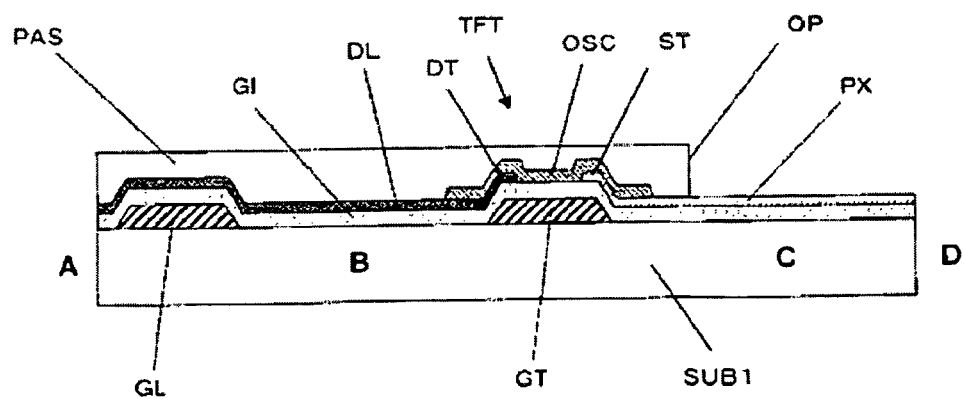

In FIGS. 1A and 1B, the gate line GL and the gate electrode GT are formed on a surface on a liquid crystal side of the substrate SUB1.

An insulating film GI is formed so as to cover the gate line GL and the gate electrode GT on the surface of the substrate SUB1. The insulating film GI functions as a gate insulating film in a formation region of a thin film transistor TFT.

The data line DL is formed on a top surface of the insulating film GL, and a portion of the data line DL located in the vicinity of the thin film transistor TFT extends to the formation region of the thin film transistor TFT, thereby forming a drain electrode DT of the thin film transistor TFT.

On the other hand, the pixel electrode PX is formed in a most part of the center of the top surface of the insulating film GI except a periphery of a pixel portion, and a portion of the pixel electrode PX located in the vicinity of the thin film transistor TFT extends to the formation region of the thin film transistor TFT, thereby forming a source electrode ST of the thin film transistor TFT.

A thin film transistor TFT includes a drain electrode and a source electrode, and they are exchanged with each other depending on an applied state of bias. Herein, for convenience, an electrode connected to a data line is referred to as the drain electrode DT, and an electrode connected to the pixel electrode PX is referred to as the source electrode ST.

Materials of the data line DL and the pixel electrode PX are different from each other. The data line DL is formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of Indium Tin Oxide (ITO), ZnO, or the like. On the other hand, the pixel electrode PX is formed of, for example, a transparent conductive film of ITO, ZnO, or the like.

Further, the oxide semiconductor layer OSC is formed in the formation region of the thin film transistor TFT, and the drain electrode DT and the source electrode ST are disposed below the oxide semiconductor layer OSC. The oxide semiconductor layer OSC is formed of, for example, ZnO, InGaZnO, ZnInO, ZnSnO, or the like, thereby serving as the semiconductor layer in which a channel of the thin film transistor TFT is formed.

Here, in FIG. 2, the drain electrode DT extending from the data line DL and the source electrode ST extending from the pixel electrode PX are each formed so as to overlap the gate electrode GT of the thin film transistor TFT, and the oxide semiconductor layer OSC is formed thereon so as to cover the drain electrode DT and the source electrode ST, thereby obtaining a laminated structure.

The drain electrode DT and the source electrode ST are each configured to be directly connected to the oxide semiconductor layer OSC, in which, for example, a contact layer or the like is not interposed between the oxide semiconductor layer OSC and the drain electrode DT or the source electrode ST. This is because the oxide semiconductor layer OSC can achieve ohmic connection with the drain electrode DT and the source electrode ST owing to properties of a oxide semiconductor without interposing the contact layer.

Note that, in the configuration illustrated in FIGS. 1A and 1B, the gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like. Further, the insulating film GI is formed of, for example, an insulating film such as $SiO_2$, SiN, $Al_2O_3$, or the like.

Further, a protective film PAS is formed on the surface of the substrate SUB1 on which the data line DL, the pixel electrode PX, and the thin film transistor TFT are formed as described above. An opening OP is formed in a most part of the center of the protective film PAS except the periphery of the pixel electrode PX.

The protective film PAS is provided to avoid direct contact of the thin film transistor TFT with liquid crystals. The opening OP is formed so as to position the pixel electrode PX close to the liquid crystals and easily control molecules of the liquid crystals.

Note that, for example, in FIG. 1A, the retention capacitor line RC is formed in the same layer as the gate line GL (gate electrode GT), and is formed while overlapping the pixel electrode PX via the insulating film GI. A capacitor in which the insulating film GI is used as a dielectric film is formed between the retention capacitor line RC and the pixel electrode PX, and a video signal supplied to the pixel electrode PX is accumulated by the capacitor.

[Manufacturing Method]

Figure 3A:
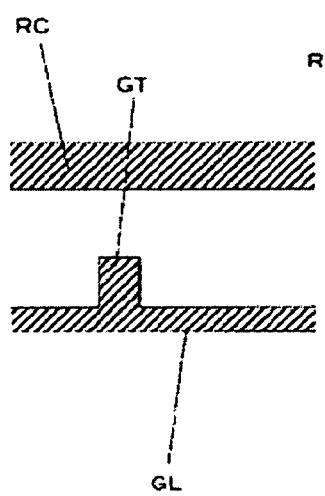
FIGS. 3A to 3C are process drawings illustrating a manufacturing method for a display device according to the embodiment of the present invention, which illustrate a process for a pixel of FIG. 2.
Figure 3B:
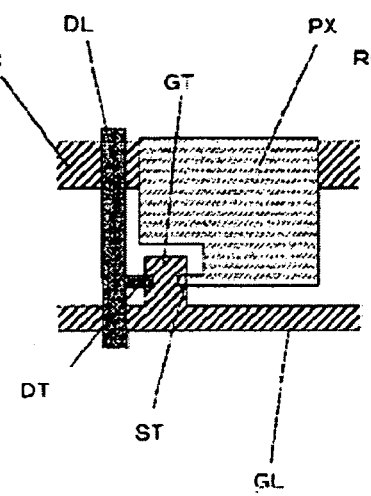
Figure 3C:
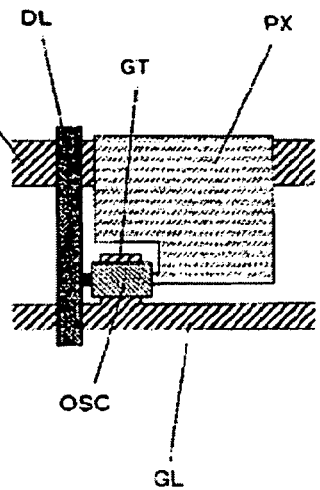

FIGS. 3A to 3C are process drawings illustrating the manufacturing method for a liquid crystal display device described above according to an embodiment of the present invention, which illustrate processes in the pixel illustrated in FIG. 2.

Hereinafter, a description is made in an order of the processes.

Process 1 (FIG. 3a)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 3B)

A metal film is formed on an entire surface of the insulating film GI and is patterned using the selective etching by the photolithography technology, to thereby form a data line DL and a drain electrode DT.

Further, a transparent conductive film is formed on a surface of the insulating film GI to cover the data line DL and the drain electrode DT and is patterned using selective etching by the photolithography technology, thereby forming an pixel electrode PX and a source electrode ST.

Process 3 (FIG. 3C)

An oxide semiconductor layer is formed on the entire surface of the substrate SUB1 to cover the data line DL, the pixel electrode PX, and the like, and is patterned using selective etching by the photolithography technology, to thereby form an oxide semiconductor layer OSC of the thin film transistor TFT.

After that, an insulating film made of, for example, a resin is formed on the entire surface of the substrate SUB1, and is patterned using selective etching by the photolithography technology to form a protective film PAS (not shown).

The protective film PAS includes an opening OP exposing most of its center portion except a slight periphery of the pixel electrode PX and a contact hole (not shown) exposing edge portions of the data line DL and the gate line GL.

In the processes described above, selective etching by the photolithography technology is used for processing the metal layer or the like into a desired pattern. However, the patterning method is not limited thereto, and for example, a printing technology may be used.

As described above, the manufacturing method for a liquid crystal display device according to this embodiment reveals that, in a liquid crystal display region of a surface on a liquid crystal side of the substrate SUB1, the liquid crystal display device can be manufactured by six layers of laminated films through five times of pattern forming processes.

In the configuration of this embodiment, the metal film is used for the data line DL, and the transparent conductive film is used for the pixel electrode PX, and thus there can be avoided an inconvenience where electric resistance of the data line DL is increased in the case where the transparent conductive film or the like is used for both the data line DL and the pixel electrode PX in the display device described in the above-mentioned JP 2004-349583 A.

Besides, there can be avoided an inconvenience where in the case where metal is used for both the data line DL and the pixel electrode PX in the display device described in JP 2004-349583 A, the data line DL and the pixel electrode PX cannot be applied to a transmissive liquid crystal display device.

Further, when stress is reduced using metal for the data line DL, there can be avoided an inconvenience where the display device is difficult to be made flexible in the case where a hard ITO or the like is used for the data line DL.

Second Embodiment

Configuration of Pixel

Figure 4A:
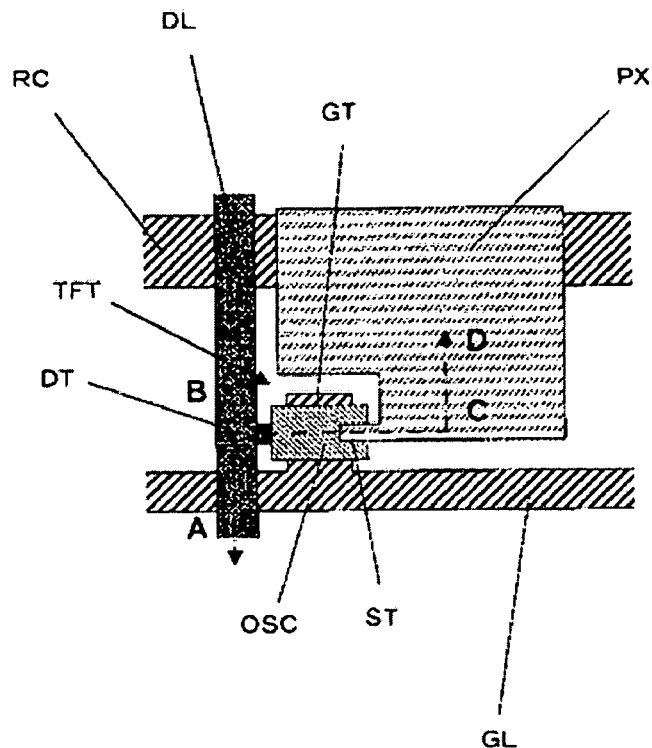
FIGS. 4A and 4B are configuration diagrams illustrating a configuration of a pixel of a display device according to another embodiment of the present invention.
Figure 4B:
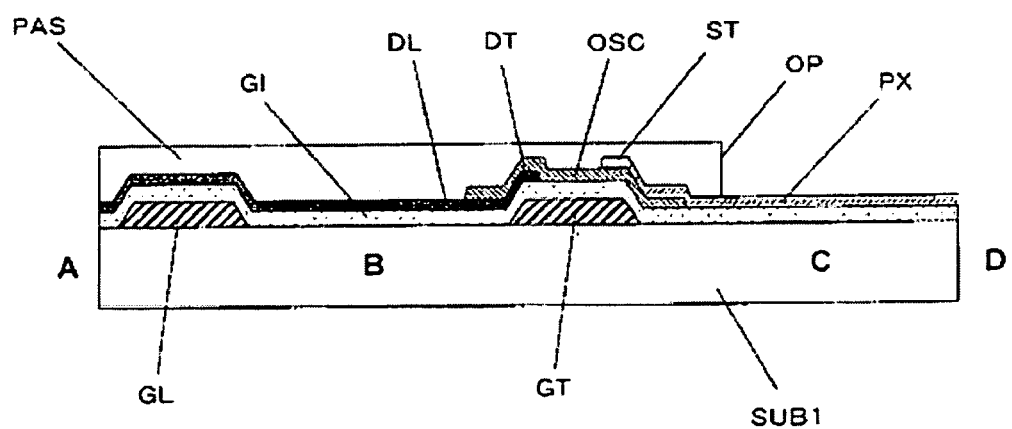

FIG. 4A is a plan view illustrating the configuration of the pixel of the display device according to another embodiment of the present invention, which corresponds to FIG. 1A. Besides, FIG. 4B is a cross-sectional view taken along the line A-B-C-D of FIG. 4A. The same components as those of FIGS. 1A and 1B have the same functions as those of FIGS. 1A and 1B.

The configurations of FIGS. 4A and 4B are different from those of FIGS. 1A and 1B in that the pixel electrode PX is formed on the oxide semiconductor layer OSC of the thin film transistor TFT, and the source electrode ST of the thin film transistor TFT, which is formed integrally with the pixel electrode PX, is formed to overlap the gate electrode GT and to be brought into direct contact with a top surface of the oxide semiconductor layer OSC.

Note that the configurations illustrated in FIGS. 4A and 4B are the same as those of FIGS. 1A and 1B in that the data line DL is formed below the oxide semiconductor layer OSC of the thin film transistor TFT, and the drain electrode DT integrally formed with the data line DL is formed to overlap the gate electrode GT and to be brought into direct contact with a bottom surface of the oxide semiconductor layer OSC.

In this case, the gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like. The gate insulating film GI is formed of, for example, an insulating film of $SiO_2$, SiN, $Al_2O_3$, or the like. The data line DL is formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like. The pixel electrode PX is formed of, for example, a transparent conductive film of ITO, ZnO, or the like, and the oxide semiconductor layer OSC is formed of, for example, ZnO, InGaZnO, ZnInO, ZnSnO, or the like.

[Manufacturing Method]

Figure 5A:
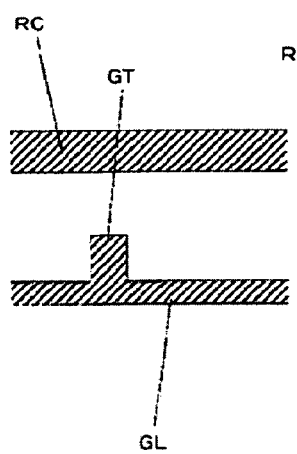
FIGS. 5A to 5C are process drawings illustrating a manufacturing method for a display device according to the another embodiment of the present invention, which illustrate a process for the pixel of FIGS. 4A and 4B.
Figure 5B:
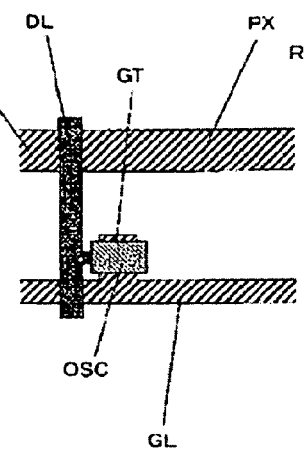
Figure 5C:
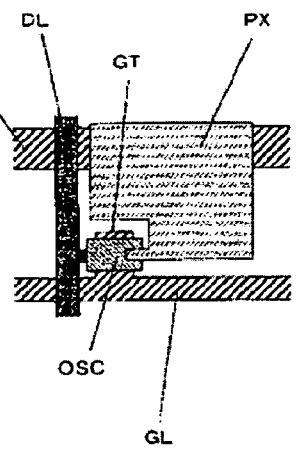

FIGS. 5A to 5C are process drawings illustrating a manufacturing method for a liquid crystal display device according to an embodiment of the present invention, which illustrate processes in the pixel illustrated in FIGS. 4A and 4B.

Hereinafter, a description is made in an order of the processes.

Process 1 (FIG. 5A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 5B)

A metal film is formed on an entire surface of the insulating film GI and is patterned using the selective etching by the photolithography technology, to thereby form a data line DL and a drain electrode DT.

Further, an oxide semiconductor layer is formed on the entire surface of the substrate SUB1 to cover the data line DL and the drain electrode DT, and is patterned using selective etching by the photolithography technology, to thereby form an oxide semiconductor layer OSC of the thin film transistor TFT.

Process 3 (FIG. 5C)

A transparent conductive film is formed on a surface of the insulating film GI to cover the oxide semiconductor layer OSC and the like and is patterned using selective etching by the photolithography technology, thereby forming an pixel electrode PX and a source electrode.

After that, an insulating film made of, for example, a resin is formed on the entire surface of the substrate SUB1, and is patterned using selective etching by the photolithography technology to form a protective film PAS (not shown).

The protective film PAS includes an opening OP exposing most of its center portion except a slight periphery of the pixel electrode PX and a contact hole (not shown) exposing edge portions of the data line DL and the gate line GL.

In the processes described above, selective etching by the photolithography technology is used for processing the metal layer or the like into a desired pattern. However, the patterning method is not limited thereto, and for example, a printing technology may be used.

As described above, the manufacturing method for a liquid crystal display device according to this embodiment reveals that, in a liquid crystal display region of a surface on a liquid crystal side of the substrate SUB1, the liquid crystal display device can be manufactured by six layers of laminated films through five times of pattern forming processes.

In the configuration of this embodiment, the metal film is used for the data line DL, and the transparent conductive film is used for the pixel electrode PX, and thus there can be avoided an inconvenience where electric resistance of the data line DL is increased in the case where the ITO or the like is used for both the data line DL and the pixel electrode PX in the display device described in the above-mentioned JP 2004-349583 A.

Besides, there can be avoided an inconvenience where in the case where metal is used for both the data line DL and the pixel electrode PX in the display device described in JP 2004-349583 A, the data line DL and the pixel electrode PX cannot be applied to a transmissive liquid crystal display device.

Further, when stress is reduced using metal for the data line DL, there can be avoided an inconvenience where the display device is difficult to be made flexible in the case where a hard ITO or the like is used for the data line DL.

Third Embodiment

Configuration of Pixel

Figure 6A:
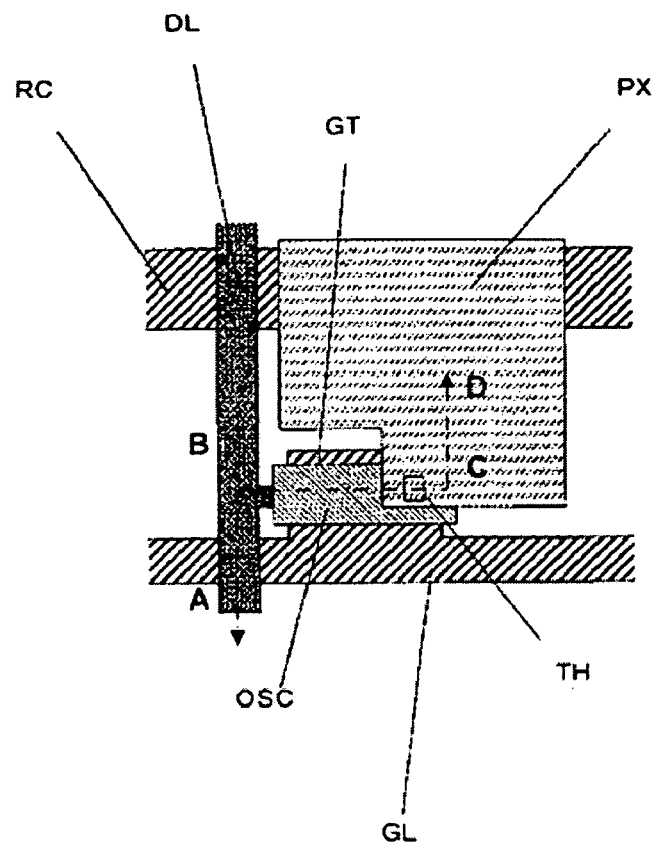
FIGS. 6A and 6B are configuration diagrams illustrating a configuration of a pixel of a display device according to another embodiment of the present invention.
Figure 6B:
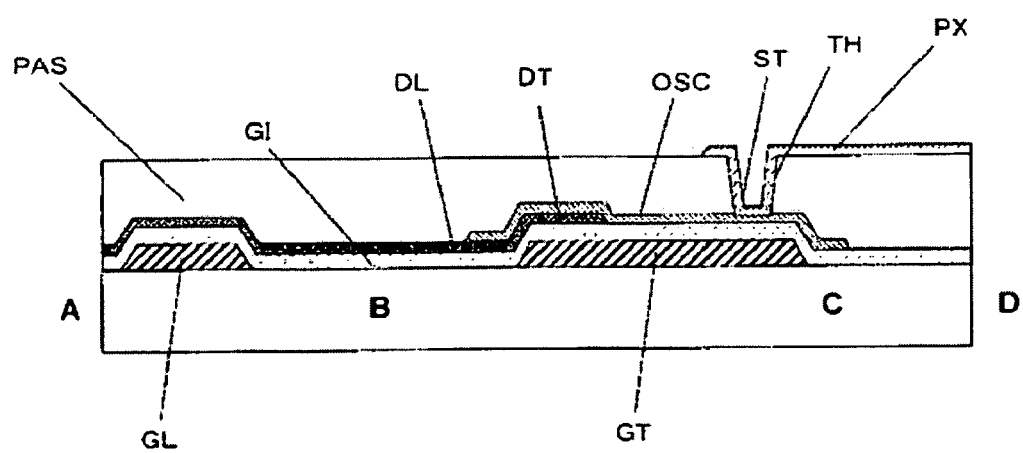

FIG. 6A is a plan view illustrating the configuration of the pixel of the display device according to another embodiment of the present invention, which corresponds to FIG. 1A. FIG. 6B is a cross-sectional view taken along the line A-B-C-D of FIG. 6A. The same components as those of FIGS. 1A and 1B have the same functions as those of FIGS. 1A and 1B.

The configurations of FIGS. 6A and 6B are different from those of FIGS. 1A and 1B in that the protective film PAS is formed over an entire surface of the substrate SUB1, and the pixel electrode PX is formed on the top surface of the protective film PAS.

Besides, a portion of the pixel electrode PX, which is close to the thin film transistor TFT, is connected to a part (source region) of the oxide semiconductor layer OSC of the thin film transistor TFT through a through hole TH formed in the protective film PAS.

In this case, a connection portion between the oxide semiconductor layer OSC and the pixel electrode PX overlaps the gate electrode GT.

Note that the configurations illustrated in FIGS. 6A and 6B are the same as those of FIGS. 1A and 1B in that the data line DL is formed below the oxide semiconductor layer OSC of the thin film transistor TFT, and the drain electrode DT integrally formed with the data line DL is formed to overlap the gate electrode GT and to be brought into direct contact with a bottom surface of the oxide semiconductor layer OSC.

The gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The gate insulating film GI is formed of, for example, an insulating film of $SiO_2$, SiN, $Al_2O_3$, or the like.

The data line DL is formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The pixel electrode PX is formed of, for example, a transparent conductive film of ITO, ZnO, or the like, and the oxide semiconductor layer OSC is formed of, for example, ZnO, InGaZnO, ZnInO, ZnSnO, or the like.

[Manufacturing Method]

Figure 7A:
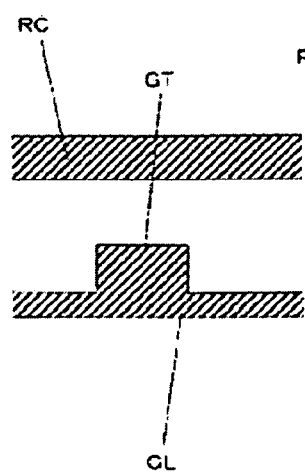
FIGS. 7A to 7C are process drawings illustrating a manufacturing method for a display device according to the another embodiment of the present invention, which illustrate a process for the pixel of FIGS. 6A and 6B.
Figure 7B:
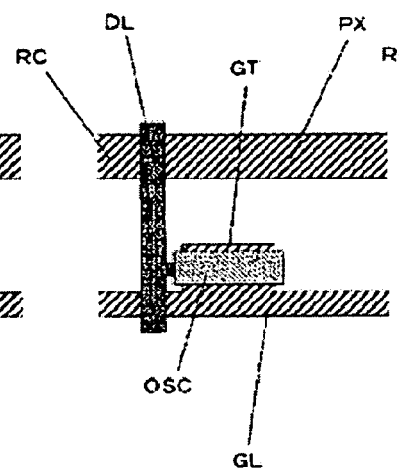
Figure 7C:
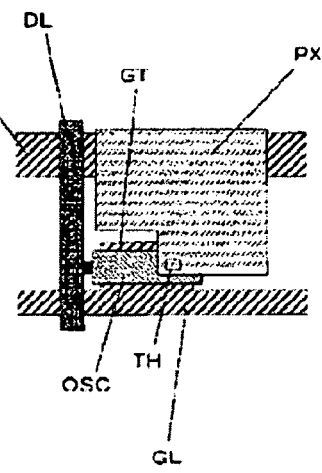

FIGS. 7A to 7C are process drawings illustrating a manufacturing method for a liquid crystal display device according to an embodiment of the present invention, which illustrate processes in the pixel illustrated in FIGS. 6A and 6B.

Hereinafter, a description is made in an order of the processes.

Process 1 (FIG. 7A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 7B)

A metal film is formed on an entire surface of the insulating film GI and is patterned using the selective etching by the photolithography technology, to thereby form a data line DL and a drain electrode DT.

Further, an oxide semiconductor layer is formed on the entire surface of the substrate SUB1 to cover the data line DL and the drain electrode DT, and is patterned using selective etching by the photolithography technology, to thereby form an oxide semiconductor layer OSC of the thin film transistor TFT.

Process 3 (FIG. 7C)

An insulating film made of, for example, a resin is formed on the entire surface of the substrate SUB1, and is patterned using selective etching by the photolithography technology to form a protective film PAS (not shown).

In the protective film PAS, the through hole TH which exposes a part serving as the source region of the oxide semiconductor layer OSC of the thin film transistor TFT is formed through the patterning, and a contact hole (not shown) which exposes the end portions of the data line DL and the gate line GL is formed.

After that, a transparent conductive film is formed on the surface of the protective film PAS to cover the through hole TH and the contact hole and is patterned using selective etching by the photolithography technology, to thereby form the pixel electrode PX and the source electrode.

In this case, a part serving as the source electrode ST is directly connected to the part serving as the source region of the oxide semiconductor layer OSC through the through hole TH.

In the processes described above, the selective etching by the photolithography technology is used for processing the metal layer or the like with a predetermined pattern. However, the pattering method is not limited thereto, and for example, printing technology may be used.

As described above, the manufacturing method for a liquid crystal display device according to this embodiment reveals that, in a liquid crystal display region of a surface on a liquid crystal side of the substrate SUB1, the liquid crystal display device can be manufactured by six layers of laminated films through five times of pattern forming processes.

In the configuration of this embodiment, the metal film is used for the data line DL, and the transparent conductive film is used for the pixel electrode PX, and thus there can be avoided an inconvenience where electric resistance of the data line DL is increased in the case where the ITO or the like is used for both the data line DL and the pixel electrode PX in the display device described in the above-mentioned JP 2004-349583 A.

Besides, there can be avoided an inconvenience where in the case where metal is used for both the data line DL and the pixel electrode PX in the display device described in JP 2004-349583 A, the data line DL and the pixel electrode PX cannot be applied to a transmissive liquid crystal display device.

Further, when stress is reduced using metal for the data line DL, there can be avoided an inconvenience where the display device is difficult to be made flexible in the case where a hard ITO or the like is used for the data line DL.

Further, the pixel electrode PX formed on the protective layer is arranged so as to be close to the liquid crystal, which produces an effect of enabling easy control of molecules of the liquid crystal.

Fourth Embodiment

Configuration of Pixel

Figure 8A:
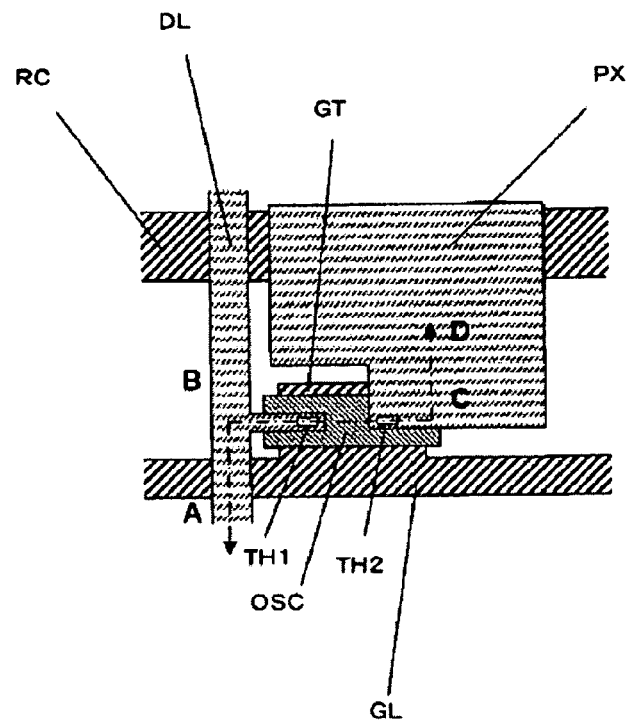
FIGS. 8A and 8B are configuration diagrams illustrating a configuration of a pixel of a display device according to another embodiment of the present invention.
Figure 8B:
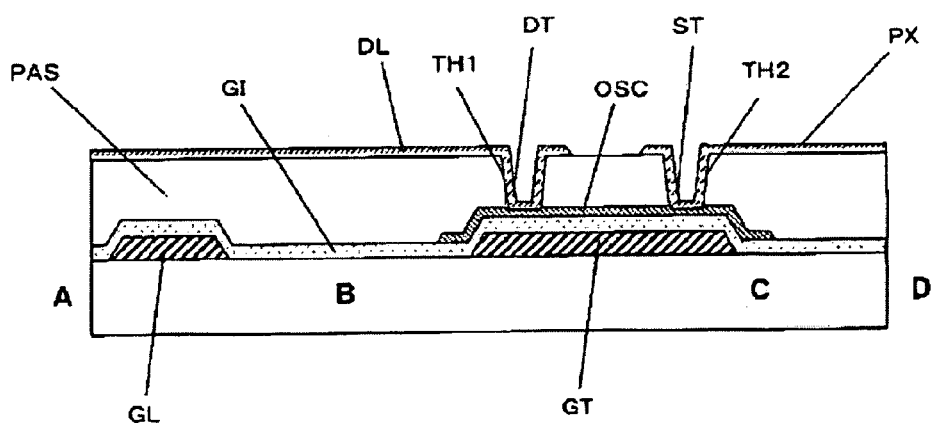

FIG. 8A is a plan view illustrating the configuration of the pixel of the display device according to another embodiment of the present invention, which corresponds to FIG. 1A. Besides, FIG. 8B is a cross-sectional view taken along the line A-B-C-D of FIG. 8A. The same components as those of FIGS. 1A and 1B have the same functions as those of FIGS. 1A and 1B.

The configurations of FIGS. 8A and 8B are different from those of FIGS. 1A and 1B in that the protective film PAS is formed over an entire surface of the substrate SUB1, and the data line DL and the pixel electrode PX are formed on the top surface of the protective film PAS.

Then, a portion of the data line DL, which is close to the thin film transistor TFT, is connected to a part (drain region) of the oxide semiconductor layer OSC of the thin film transistor TFT through a through hole TH1 formed in the protective film PAS.

Besides, a portion of the pixel electrode PX, which is close to the thin film transistor TFT, is connected to a part (source region) of the oxide semiconductor layer OSC of the thin film transistor TFT through a through hole TH2 formed in the protective film PAS.

In this case, the connection portion with the oxide semiconductor layer OSC of the data line DL functions as the drain electrode of the thin film transistor TFT and overlaps the gate electrode GT. In addition, the connection portion with the oxide semiconductor layer OSC of the pixel electrode PX functions as the source electrode and overlaps the gate electrode GT.

The gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The gate insulating film GI is formed of, for example, an insulating film of $SiO_2$, SiN, $Al_2O_3$, or the like.

The data line DL and the pixel electrode PX are each formed of, for example, a single film of molybdenum, chromium, tungsten, aluminum, copper, titanium, nickel, tantalum, silver, zinc, or other metal, an alloy film of those metals, a laminated film of those metals, a laminated film of those films and a transparent oxide layer of ITO, ZnO, or the like, or the same film such as a transparent conductive film of ITO, ZnO, or the like.

The oxide semiconductor layer OSC is formed of, for example, ZnO, InGaZnO, ZnInO, ZnSnO, or the like.

[Manufacturing Method]

Figure 9A:
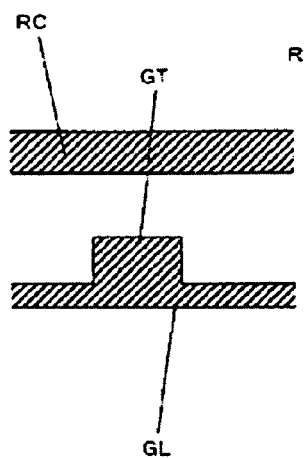
FIGS. 9A to 9C are process drawings illustrating a manufacturing method for a display device according to the another embodiment of the present invention, which illustrate a process for the pixel of FIGS. 8A and 8B.
Figure 9B:
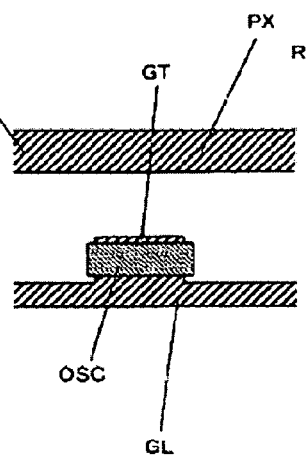
Figure 9C:
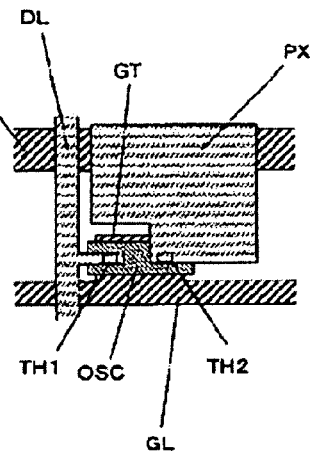

FIGS. 9A to 9C are process drawings illustrating a manufacturing method for a liquid crystal display device according to an embodiment of the present invention, which illustrate processes in the pixel illustrated in FIGS. 8A and 8B.

Hereinafter, a description is made in an order of the processes.

Process 1 (FIG. 9A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 9B)

An oxide semiconductor layer is formed on an entire surface of the insulating film GI and is patterned using selective etching by the photolithography technology, to thereby leave the oxide semiconductor layer OSC in a formation region of the thin film transistor TFT.

Process 3 (FIG. 9C)

An insulating film made of, for example, a resin is formed on the entire surface of the substrate SUB1, and is patterned using selective etching by the photolithography technology to form a protective film PAS (not shown).

In the protective film PAS, the through holes TH1 and TH2 which expose respective parts serving as the drain region and the source region of the oxide semiconductor layer OSC of the thin film transistor TFT is formed through the patterning, and a contact hole (not shown) which exposes the end portions of the data line DL and the gate line GL is formed.

After that, a metal film is formed on the surface of the protective film PAS to cover the through holes TH and the contact hole and is patterned using selective etching by the photolithography technology, to thereby form the data line DL and the pixel electrode PX.

A portion of the data line DL is connected to the drain region of the oxide semiconductor layer OSC through the through hole TH1 of the protective film PAS, and functions as the drain electrode DT of the thin film transistor TFT. Besides, a portion of the pixel electrode PX is connected to the source region of the oxide semiconductor layer OSC through the through hole TH2 of the protective film PAS, and functions as the source electrode ST of the thin film transistor TFT.

In order to form a pattern in the processes described above, for example, the photolithography technology is used. However, the patterning technology is not limited thereto, and for example, the printing method may be used.

As described above, with the configuration of this embodiment, the liquid crystal display region of a surface on the liquid crystal side of the substrate SUB1 can be manufactured using five layers of the laminated films through four times of pattern forming processes.

Moreover, with the configuration of this embodiment, a distance between the pixel electrode PX and the liquid crystal can be made small, and irregularities of the surface serving as a boundary with the liquid crystal of the substrate SUB1 can be reduced, which produces an effect of efficiently controlling the liquid crystal.

Fifth Embodiment

Configuration of Pixel

Figure 10A:
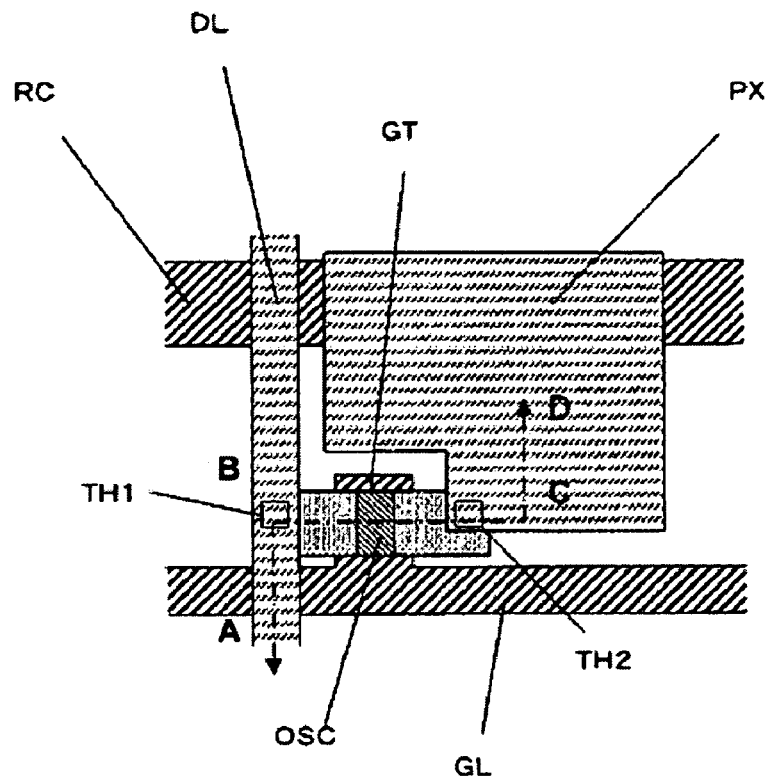
FIGS. 10A and 10B are configuration diagrams illustrating a configuration of a pixel of a display device according to another embodiment of the present invention.
Figure 10B:
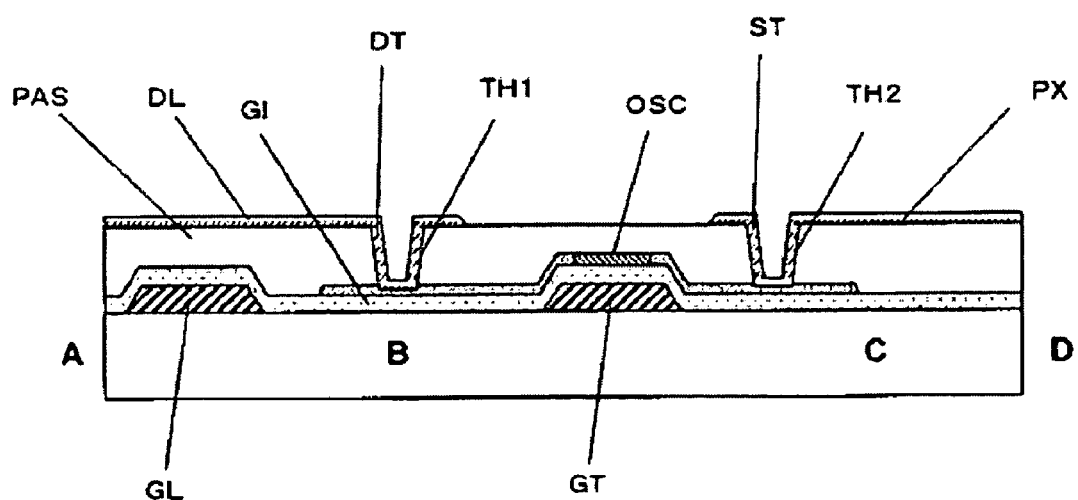

FIG. 10A is a plan view illustrating the configuration of the pixel of the display device according to another embodiment of the present invention, which corresponds to FIG. 1A. Besides, FIG. 10B is a cross-sectional view taken along the line A-B-C-D of FIG. 10A. The same components as those of FIGS. 1A and 1B have the same functions as those of FIGS. 1A and 1B.

In FIG. 10A, the oxide semiconductor layer OSC of the thin film transistor TFT is formed to have overlap with the gate electrode GT and to extend to both sides of the gate electrode GT.

The oxide semiconductor layer OSC is formed so that a region functioning as a so-called channel located directly above the gate electrode GT serves as a semiconductor layer having high resistance and a region other than the above-mentioned region serves as a semiconductor layer having low resistance.

On the surface of the substrate SUB1 on which the oxide semiconductor layer OSC described above is formed, the protective film PAS is formed to cover the oxide semiconductor layer OSC.

The data line DL is formed on the surface of the protective film PAS, and a portion thereof is directly connected to the semiconductor layer having low resistance, which is located on one end side of the oxide semiconductor layer OSC, through the through hole TH1 formed in the protective film PAS. In addition, the pixel electrode PX is formed on the surface of the protective film PAS, and a portion thereof is directly connected to the semiconductor layer having low resistance, which is located on another end side of the oxide semiconductor layer OSC, through the through hole TH2 formed in the protective film PAS.

The gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The insulating film GI is formed of, for example, an insulating film such as $SiO_2$, SiN, or $Al_2O_3$.

The data line DL and the pixel electrode PX are formed of, for example, a single film of molybdenum, chromium, tungsten, aluminum, copper, titanium, nickel, tantalum, silver, zinc, or other metal, an alloy film of those metals, a laminated film of those metals, a laminated film of those films and a transparent oxide layer of ITO, ZnO, or the like, or the same film such as a transparent conductive film of ITO, ZnO, or the like.

The oxide semiconductor layer OSC is formed of, for example, ZnO, InGaZnO, ZnInO, ZnSnO, or the like.

[Manufacturing Method]

Figure 11A:
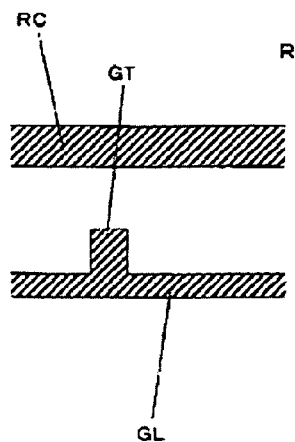
FIGS. 11A to 11C are process drawings illustrating a manufacturing method for a display device according to the another embodiment of the present invention, which illustrate a process for the pixel of FIGS. 10A and 10B.
Figure 11B:
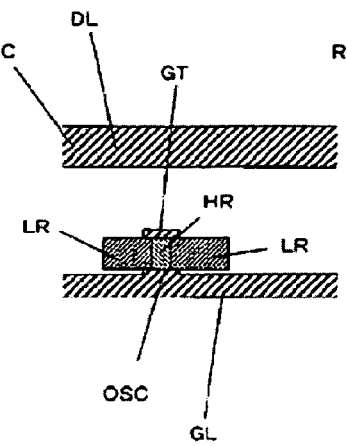
Figure 11C:
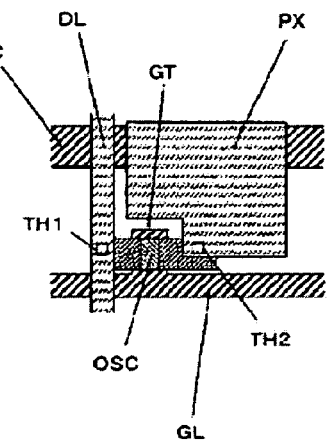

FIGS. 11A to 11C are process drawings illustrating a manufacturing method for a liquid crystal display device according to an embodiment of the present invention, which illustrate processes in the pixel illustrated in FIGS. 10A and 10B.

Hereinafter, a description is made in an order of the processes.

Process 1 (FIG. 11A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 11B)

An oxide semiconductor layer is formed on an entire surface of the insulating film GI and is patterned using selective etching by the photolithography technology, to thereby leave the oxide semiconductor layer OSC in a formation region of the thin film transistor TFT.

The oxide semiconductor layer OSC is formed so that a region functioning as a so-called channel located directly above the gate electrode GT serves as a semiconductor layer having high resistance (denoted by reference symbol HR in FIG. 11B) and a region other than the above-mentioned region serves as a semiconductor layer having low resistance (denoted by reference symbol LR in FIG. 11B).

Figure 12:
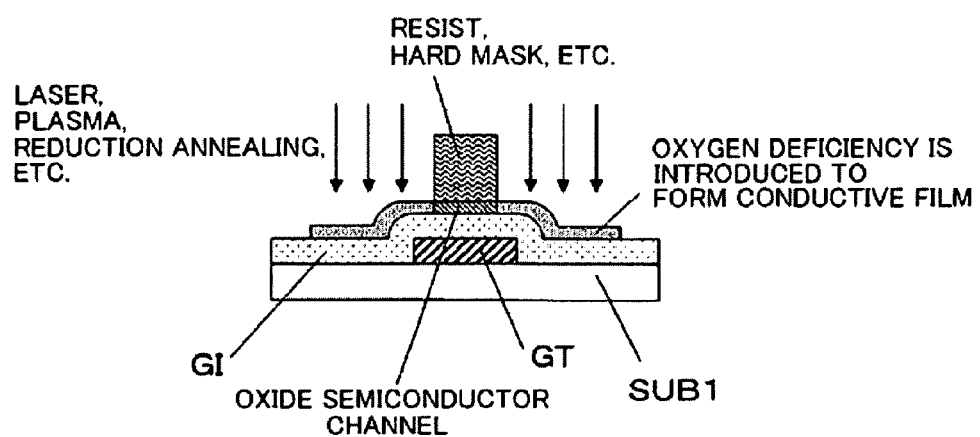
FIG. 12 is an explanatory view of a case where a low resistance region is selectively formed on an oxide semiconductor layer formed on a top surface of a substrate by a method which is applied to the manufacturing method for a display device according to the present invention.

As illustrated in FIG. 12, the oxide semiconductor layer OSC described above can be obtained by forming an oxide semiconductor layer OSC having high resistance, and then covering the thus formed oxide semiconductor layer OSC on a region which is caused to function as a channel thereof by, for example, a resist, a hard mask, or the like, thereby lowering the resistance thereof through doping of a portion exposed from the resist, the hard mask, or the like by ion implantation, thermal diffusion, or laser diffusion, or through modification of the film by laser irradiation, reduction annealing, or the like.

In this case, when a semi-translucent mask is used, the oxide semiconductor layer OSC can be patterned and a selective region of the patterned oxide semiconductor layer OSC can be made to have low resistance through the same mask process.

Process 3 (FIG. 11C)

The protective film PAS made of, for example, a resin is formed on the surface of the substrate SUB1, thereby forming the through hole TH1 exposing a portion of the semiconductor layer having low resistance, which is located on one end side of the oxide semiconductor layer OSC, and the through hole TH2 exposing a portion of the semiconductor layer having low resistance, which is located on another end side of the oxide semiconductor layer OSC.

Note that, in this case, a contact hole (not shown) for exposing end portions of the data line DL and the gate line GL is also formed.

After that, a transparent conductive film is formed on the surface of the protective film PAS to cover the through holes TH1 and TH2 and the contact hole and is patterned using selective etching by the photolithography technology, to thereby form the data line DL and the pixel electrode PX.

A portion of the data line DL is connected to the semiconductor layer having low resistance (the drain region), which is located on the one end side of the oxide semiconductor layer OSC, through the through holes TH1 of the protective film PAS, and functions as the drain electrode DT of the thin film transistor TFT. Besides, a portion of the pixel electrode PX is connected to the semiconductor layer having low resistance (the source region), which is located on the another end side of the oxide semiconductor layer OSC, through the through hole TH2 of the protective film PAS, and functions as the source electrode ST of the thin film transistor TFT.

In order to form a pattern in the processes described above, for example, the photolithography technology is used. However, the patterning method is not limited thereto, and for example, the printing technology may be used.

As described above, by the manufacturing method according to this embodiment, the liquid crystal display region of a surface on the liquid crystal side of the substrate SUB1 can be manufactured using five layers of the laminated films through five times of pattern forming processes.

Moreover, with the configuration of this embodiment, a distance between the pixel electrode PX and the liquid crystal can be made small, and irregularities of the surface of the substrate SUB1 can be reduced, which produces an effect of efficiently controlling the liquid crystal.

Sixth Embodiment

Configuration of Pixel

Figure 13A:
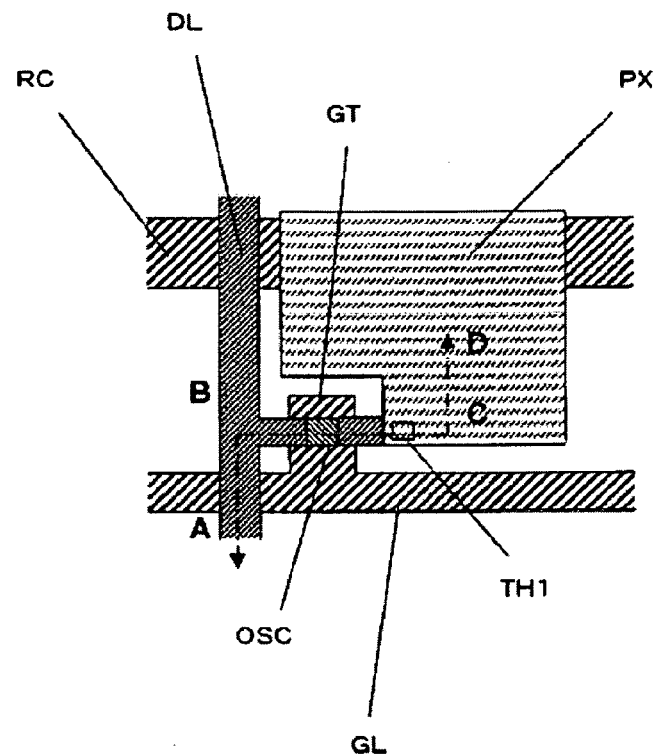
FIGS. 13A and 13B are configuration diagrams illustrating a configuration of a pixel of a display device according to another embodiment of the present invention.
Figure 13B:
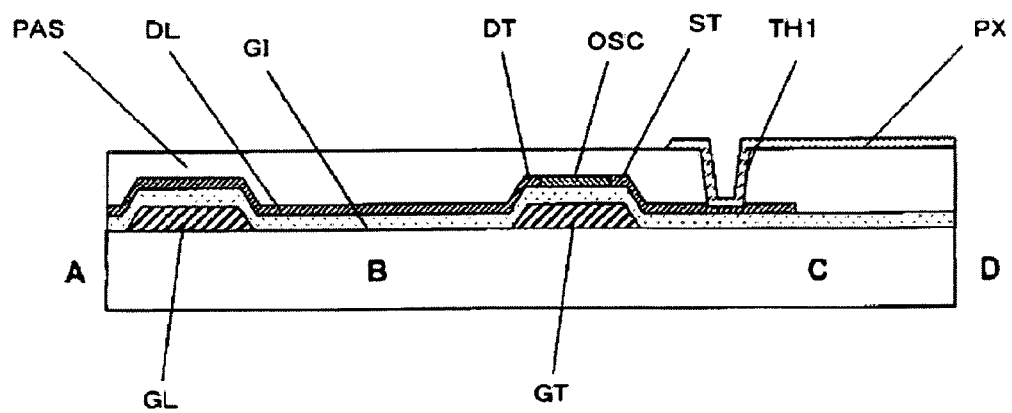

FIG. 13A is a plan view illustrating the configuration of the pixel of the display device according to another embodiment of the present invention, which corresponds to FIG. 10A. Besides, FIG. 13B is a cross-sectional view taken along the line A-B-C-D of FIG. 13A. The same components as those of FIGS. 10A and 10B have the same functions as those of FIGS. 10A and 10B.

The configurations of FIGS. 13A and 13B are different from those of FIGS. 10A and 10B in that the data line DL and the oxide semiconductor layer OSC are formed in the same layer. In addition, the oxide semiconductor layer OSC is formed so that a region which is caused to function as a channel of the thin film transistor TFT has high resistance and a region other than the above-mentioned region has low resistance, and the data line DL is formed integrally with the semiconductor layer having low resistance, which is located on the one end side of the oxide semiconductor layer OSC.

In other words, the data line DL is configured as the part in which the resistance of the oxide semiconductor layer OSC is lowered.

Note that, as in the case of FIGS. 10A and 10B, the pixel electrode PX is formed on a top surface of the protective film PAS and is directly connected to the semiconductor layer located on an another end side of the oxide semiconductor layer OSC through the through hole TH formed in the protective film PAS.

The gate line GL and the gate electrode GT are formed of a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The insulating film GI is formed of, for example, an insulating film such as $SiO_2$, SiN, or $Al_2O_3$.

The pixel electrode PX is formed of a transparent conductive film of ITO or ZnO, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The oxide semiconductor layer OSC which also serves as a material of the data line DL is formed of, for example, an oxide such as ZnO, InGaZnO, ZnInO, ZnSnO, or the like.

[Manufacturing Method]

Figure 14A:
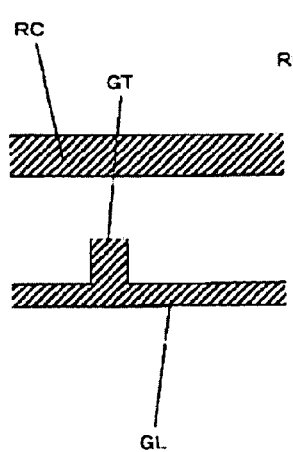
FIGS. 14A to 14C are process drawings illustrating a manufacturing method for a display device according to the another embodiment of the present invention, which illustrate a process for the pixel of FIGS. 13A and 13B.
Figure 14B:
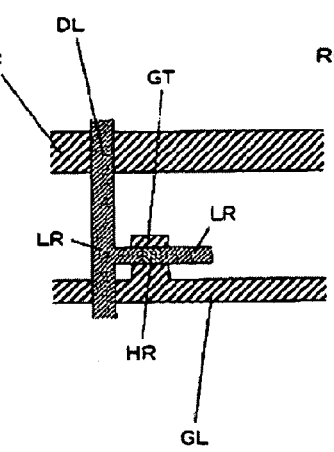
Figure 14C:
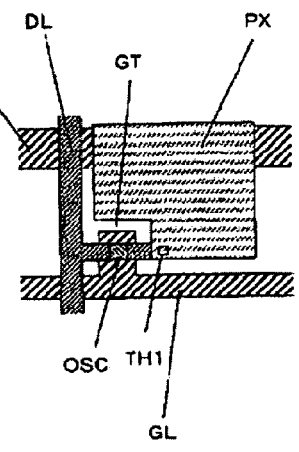

FIGS. 14A to 14C are process drawings illustrating a manufacturing method for a liquid crystal display device according to an embodiment of the present invention, which illustrate processes in the pixel illustrated in FIGS. 13A and 13B.

Hereinafter, a description is made in an order of the processes.

Process 1 (FIG. 14A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 14B)

An oxide semiconductor layer is formed on an entire surface of the insulating film GI and is patterned using selective etching by the photolithography technology, to thereby leave the oxide semiconductor layer OSC in formation regions of the data line DL and the thin film transistor TFT.

The oxide semiconductor layer OSC located in the formation region of the data line DL and the oxide semiconductor layer OSC located in the formation region of the thin film transistor TFT are formed in patterns continuous with each other.

The oxide semiconductor layer OSC is formed so that a region functioning as a so-called channel located directly above the gate electrode GT serves as a semiconductor layer having high resistance (denoted by reference symbol HR in FIG. 14B) and a region other than the above-mentioned region serves as a semiconductor layer having low resistance (denoted by reference symbol LR in FIG. 14B).

From the above, the data line DL and the drain electrode DT of the thin film transistor TFT, which is connected to the data line DL, are formed of the semiconductor layer having low resistance of the oxide semiconductor layer OSC.

As illustrated in FIG. 12, the oxide semiconductor layer OSC described above can be obtained by forming the oxide semiconductor layer OSC having high resistance, and then covering the thus formed oxide semiconductor layer OSC on a region which is caused to function as a channel thereof by, for example, a resist, a hard mask, or the like, thereby lowering the resistance thereof through doping of a portion exposed from the resist, the hard mask, or the like by ion implantation, thermal diffusion, or laser diffusion, or through modification of the film by laser irradiation, reduction annealing, or the like.

In this case, when a semi-translucent mask is used, the oxide semiconductor layer OSC can be patterned and a selective region of the patterned oxide semiconductor layer OSC can be made to have low resistance through the same mask process.

Process 3 (FIG. 14C)

The protective film PAS made of, for example, a resin is formed on the surface of the substrate SUB1, thereby forming the through hole TH1 exposing a portion of the semiconductor layer having low resistance, which becomes a source region of the oxide semiconductor layer OSC.

Note that, in this case, a contact hole (not shown) for exposing end portions of the data line DL and the gate line GL is also formed in the protective film PAS.

After that, a transparent conductive film is formed on the surface of the protective film PAS to cover the through hole TH1 and the contact hole and is patterned using selective etching by the photolithography technology, to thereby form the pixel electrode PX.

A portion of the pixel electrode PX is connected to the semiconductor layer having low resistance, which becomes the source region of the oxide semiconductor layer OSC, through the through hole TH1 of the protective film PAS, and functions as the source electrode ST of the thin film transistor TFT.

In order to form a pattern in the processes described above, for example, the photolithography technology is used. However, the patterning method is not limited thereto, and for example, the printing technology may be used.

As described above, by the manufacturing method according to this embodiment, the liquid crystal display region of a surface on the liquid crystal side of the substrate SUB1 can be manufactured using five layers of the laminated films through five times of pattern forming processes.

Moreover, with the configuration of this embodiment, a distance between the pixel electrode PX and the liquid crystal can be made small, and irregularities of the surface of the substrate SUB1 can be reduced, which produces an effect of efficiently controlling the liquid crystal.

Seventh Embodiment

Configuration of Pixel

Figure 15A:
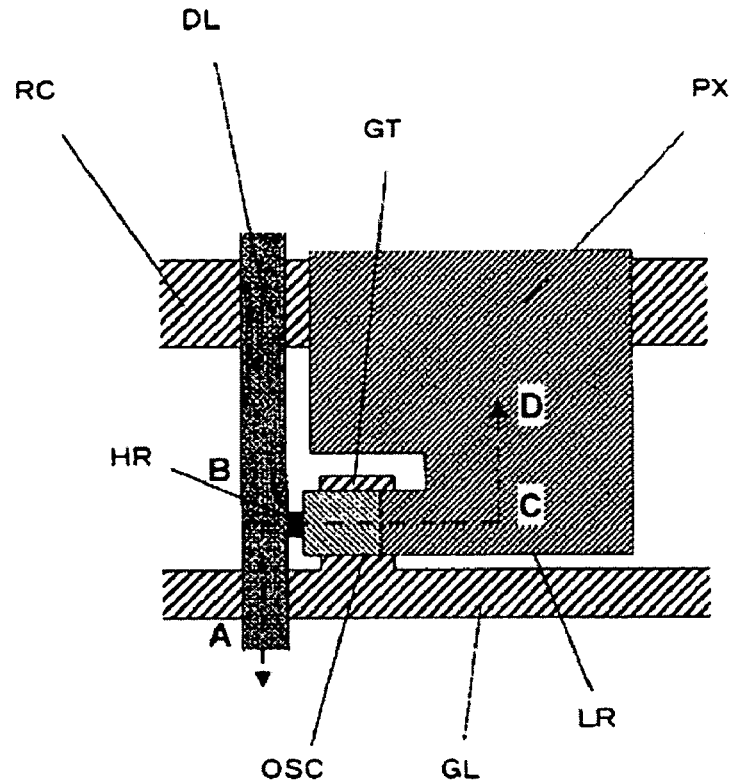
FIGS. 15A and 15B are configuration diagrams illustrating a configuration of a pixel of a display device according to another embodiment of the present invention.
Figure 15B:
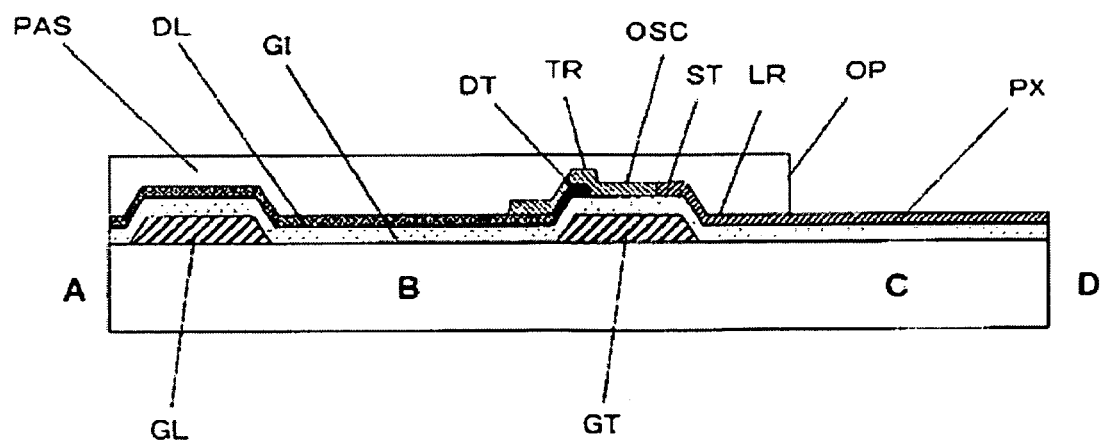

FIG. 15A is a plan view illustrating the configuration of the pixel of the display device according to another embodiment of the present invention, which corresponds to FIG. 1A. Besides, FIG. 15B is a cross-sectional view taken along the line A-B-C-D of FIG. 15A. The same components as those of FIGS. 1A and 1B have the same functions as those of FIGS. 1A and 1B.

The configurations of FIGS. 15A and 15B are different from those of FIGS. 1A and 1B in that the pixel electrode PX extends from the oxide semiconductor layer OSC serving as the semiconductor layer of the thin film transistor TFT to be formed integrally therewith, and is formed of a region in which the resistance of the oxide semiconductor layer OSC is lowered (denoted by reference symbol LR).

Accordingly, the oxide semiconductor layer OSC of the thin film transistor TFT, which is formed above the gate electrode GT, has a high resistance region (denoted by reference symbol HR) which becomes the channel region of the thin film transistor TFT, and a boundary with the pixel electrode PX is located above the gate electrode GT.

Note that a portion adjacent to the boundary with the channel region of the pixel electrode PX functions as the source electrode ST of the thin film transistor TFT.

The drain electrode DT of the thin film transistor TFT, which is formed integrally with the data line DL, is located below the oxide semiconductor layer OSC having the high resistance, and is directly connected to the oxide semiconductor layer OSC, which is the same configuration as the configurations of FIGS. 1A and 1B.

Besides, the opening OP exposing most of the center other than a slight periphery of the pixel electrode PX is formed in the protective film PAS which is formed to cover the thin film transistor TFT or the like, which is the same configuration as the configurations of FIGS. 1A and 1B.

The gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The gate insulating film GI is formed of, for example, an insulating film of $SiO_2$, SiN, $Al_2O_3$, or the like.

The data line DL is formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The oxide semiconductor layer OSC is formed of, for example, ZnO, InGaZnO, ZnInO, ZnSnO, or the like.

[Manufacturing Method]

Figure 16A:
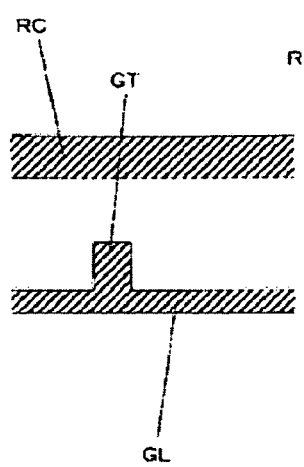
FIGS. 16A to 16C are process drawings illustrating a manufacturing method for a display device according to the another embodiment of the present invention, which illustrate a process for the pixel of FIGS. 15A and 15B.
Figure 16B:
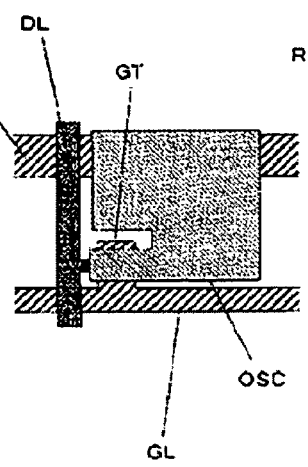
Figure 16C:
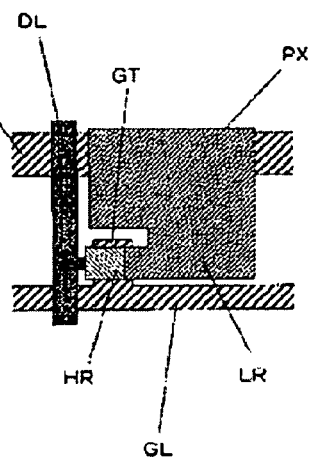

FIGS. 16A to 16C are process drawings illustrating a manufacturing method for a liquid crystal display device according to an embodiment of the present invention, which illustrate processes in a pixel of a liquid crystal display region.

Hereinafter, a description is made in an order of the processes.

Process 1 (FIG. 16A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 16B)

A metal film is formed on an entire surface of the insulating film GI and is patterned using the selective etching by the photolithography technology, to thereby form a data line DL and a drain electrode DT.

Further, the oxide semiconductor layer OSC is formed on the surface of the insulating film GI to cover the data line DL and the drain electrode DT, is patterned using the selective etching by the photolithography technology, and is left also in formation regions of the pixel electrode PX and the source electrode ST in addition to the formation region of the semiconductor layer of the thin film transistor TFT.

Process 3 (FIG. 16C)

In an entire region of the oxide semiconductor layer OSC, the formation regions of the pixel electrode PX and the source electrode ST are made to have low resistance.

As described above, the resistance of the oxide semiconductor layer OSC is selectively lowered by covering a region whose resistance is not lowered (in this case, regions functioning as a channel and a drain) by, for example, a resist or a hard mask, and modifying the film through doping by ion implantation, thermal diffusion, laser diffusion, or the like, or through laser irradiation, reduction annealing, or the like.

In this case, when the semi-translucent mask is used as a mask, through one mask process, the oxide semiconductor layer OSC can be selectively removed, and its resistance can be selectively lowered.

After that, an insulating film made of, for example, a resin is formed on the entire surface of the substrate SUB1, and is patterned using selective etching by the photolithography technology to form a protective film PAS (not shown).

The protective film PAS includes an opening OP exposing most of its center portion except a slight periphery of the pixel electrode PX and a contact hole (not shown) exposing edge portions of the data line DL and the gate line GL.

In the processes described above, selective etching by the photolithography technology is used for processing the metal layer or the like into a desired pattern. However, the patterning method is not limited thereto, and for example, a printing technology may be used.

As described above, the manufacturing method for a liquid crystal display device according to this embodiment reveals that, in a liquid crystal display region of a surface on a liquid crystal side of the substrate SUB1, the liquid crystal display device can be manufactured by five layers of laminated films through four times of pattern forming processes.

Eighth Embodiment

Configuration of Pixel

Figure 17A:
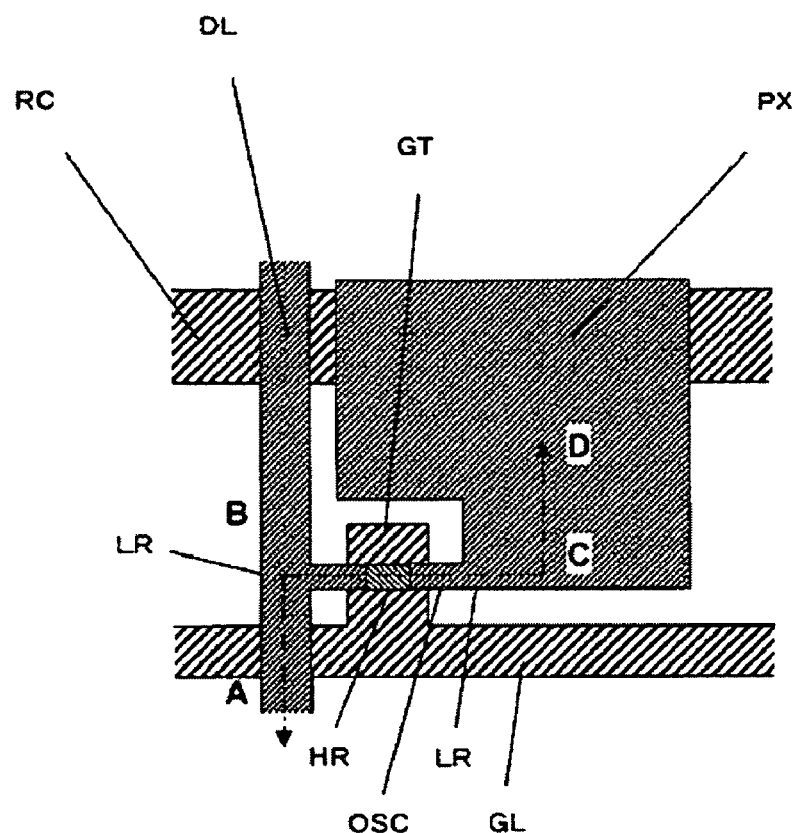
FIGS. 17A and 17B are configuration diagrams illustrating a configuration of a pixel of a display device according to another embodiment of the present invention.

FIG. 17A is a plan view illustrating the configuration of the pixel of the display device according to another embodiment of the present invention, which corresponds to FIG. 15A.

Figure 17B:
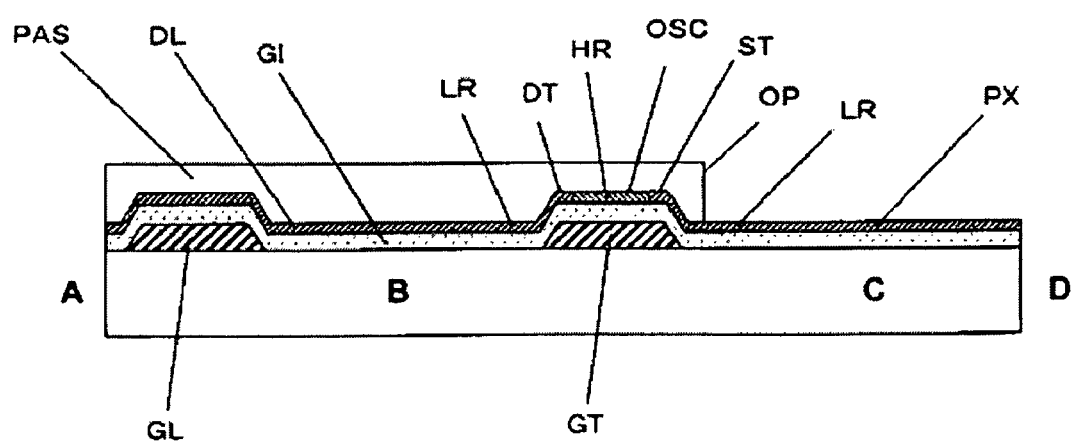

Besides, FIG. 17B is a cross-sectional view taken along the line A-B-C-D of FIG. 17A. The same components as those of FIGS. 15A and 15B have the same functions as those of FIGS. 15A and 15B.

The configurations of FIGS. 17A and 17B are different from those of FIGS. 15A and 15B in that the drain electrode of the thin film transistor TFT, which is formed integrally with the data line DL, extends from the oxide semiconductor layer OSC serving as the semiconductor layer of the thin film transistor TFT to be formed integrally therewith, which is formed by a region in which the resistance of the oxide semiconductor layer OSC is lowered (denoted by reference symbol LR).

The oxide semiconductor layer OSC of the thin film transistor TFT, which is formed above the gate electrode GT, has a high resistance region (denoted by reference symbol HR) which becomes the channel region of the thin film transistor TFT, and a boundary with the data line DL is located above the gate electrode GT.

Note that a portion adjacent to the boundary with the channel region of the data line DL functions as the drain electrode DT of the thin film transistor TFT.

The gate line GL and the gate electrode GT are formed of, for example, a single film of molybdenum, chromium, tungsten, aluminum, copper, titanium, nickel, tantalum, silver, zinc, or other metal, an alloy film of those metals, a laminated film of those metals, or a laminated film of those films and a transparent oxide layer of ITO, ZnO, or the like.

The gate insulating film GI is formed of, for example, an insulating film of $SiO_2$, SiN, $Al_2O_3$, or the like.

The oxide semiconductor layer OSC is formed of, for example, ZnO, InGaZnO, ZnInO, ZnSnO, or the like.

[Manufacturing Method]

FIGS. 18A to 18C are process drawings illustrating a manufacturing method for a liquid crystal display device according to an embodiment of the present invention, which illustrate processes in a pixel of a liquid crystal display region.

Hereinafter, a description is made in an order of the processes.

Process 1 (FIG. 18A)

A substrate SUB1 made of, for example, glass is prepared, and a metal film, for example, is formed on an entire surface (surface of a liquid crystal side) of the substrate SUB1.

Then, the metal film is patterned using selective etching by a well-known photolithography technology, thereby forming a gate line GL, a gate electrode GT, and a retention capacitor line RC.

After that, on the surface of the substrate SUB1, an insulating film GI (not shown) is formed to cover the gate line GL, the gate electrode GT, and the retention capacitor line RC.

Process 2 (FIG. 18B)

The oxide semiconductor layer OSC is formed on a surface of the insulating film GI. In this case, for example, an oxide semiconductor layer whose resistance is lowered is used as the oxide semiconductor layer OSC in this embodiment.

Then, the oxide semiconductor layer OSC is patterned using selective etching by the photolithography technology, and is left on formation regions of the pixel electrode PX and the source electrode ST and formation regions of the data line DL and the drain electrode DT in addition to the formation region of the semiconductor layer of the thin film transistor TFT.

Process 3 (FIG. 18C)

In an entire region of the oxide semiconductor layer OSC, a part other than a part corresponding to a channel region of the thin film transistor TFT is made to have high resistance.

The resistance of the oxide semiconductor layer OSC is selectively lowered by covering a region whose resistance is not lowered (in this case, a channel region) by, for example, a resist or a hard mask, and modifying the film through doping into a portion other than the above-mentioned region by ion implantation, thermal diffusion, laser diffusion, or the like, or through laser irradiation, reduction annealing, or the like.

In this case, when the semi-translucent mask is used as a mask, through one mask process, the oxide semiconductor layer OSC can be selectively removed, and a resistance of a region can be selectively lowered.

After that, an insulating film made of, for example, a resin is formed on the entire surface of the substrate SUB1, and is patterned using selective etching by the photolithography technology to form a protective film PAS (not shown).

The protective film PAS includes an opening OP exposing most of its center portion except a slight periphery of the pixel electrode PX and a contact hole (not shown) exposing edge portions of the data line DL and the gate line GL.

In the processes described above, selective etching by the photolithography technology is used for processing the metal layer or the like into a desired pattern. However, the patterning method is not limited thereto, and for example, a printing technology may be used.

As described above, the manufacturing method for a liquid crystal display device according to this embodiment reveals that, in a liquid crystal display region of a surface on a liquid crystal side of the substrate SUB1, the liquid crystal display device can be manufactured by four layers of laminated films through three times of pattern forming processes.

Ninth Embodiment

Configuration of Pixel

Figure 19A:
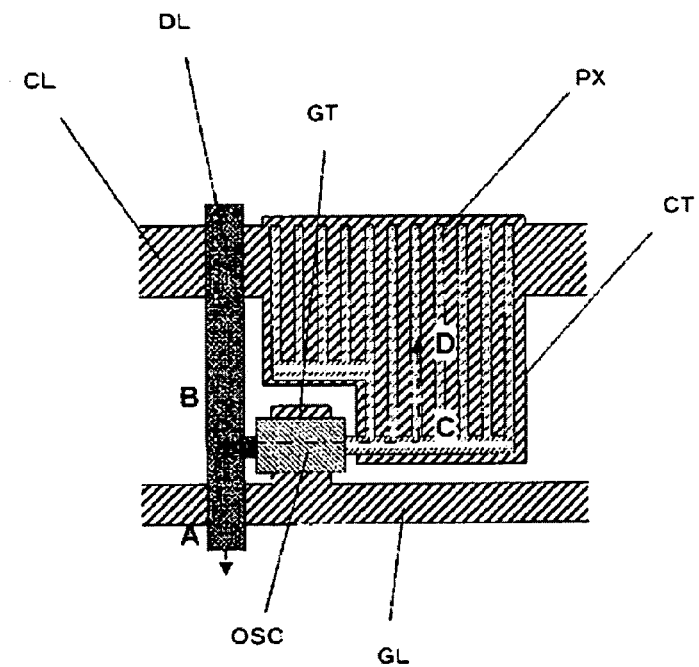
FIGS. 19A and 19B are configuration diagrams illustrating a configuration of a pixel of a display device according to another embodiment of the present invention.
Figure 19B:
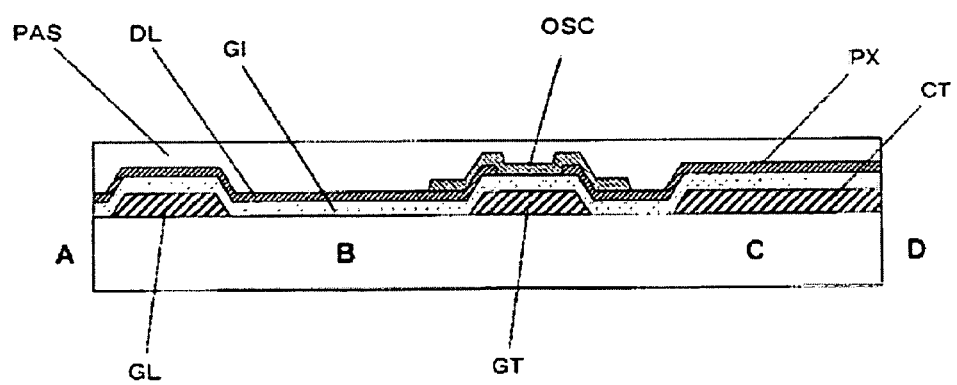

FIG. 19A is a plan view illustrating the configuration of the pixel of the display device according to another embodiment of the present invention, which corresponds to FIG. 1A. Besides, FIG. 19B is a cross-sectional view taken along the line A-B-C-D of FIG. 19A. The same components as those of FIGS. 1A and 1B have the same functions as those of FIGS. 1A and 1B.

The configurations of FIGS. 19A and 19B are different from those of FIGS. 1A and 1B in that a flat-plate like counter electrode CT is formed in most pixel region in the same layer as the gate signal line GL, and the pixel electrode PX is formed above the counter electrode CT through the insulating film GI to overlap the counter electrode CT.

Besides, the counter electrode CT is supplied with a reference signal through a common line CL formed integrally with the counter electrode CT to be parallel to the gate signal line GL.

Further, the pixel electrode PX supplied with a video signal is formed of, for example, an electrode group which is formed in a comb-shaped pattern and includes a plurality of linear electrodes disposed in parallel to one another.

The liquid crystal display device described above has a configuration (in-plane-switching (IPS) configuration) in which an electric field partially containing an electric field component parallel to the surface of the substrate SUB1 (so-called lateral electric field) is generated between the pixel electrode PX and the counter electrode CT to drive molecules of the liquid crystal.

In the configurations illustrated in FIGS. 19A and 19B, the above-mentioned IPS configuration is applied to the configurations illustrated in FIGS. 1A and 1B, and can also be applied to the respective embodiments described above.

Tenth Embodiment

Figure 20:
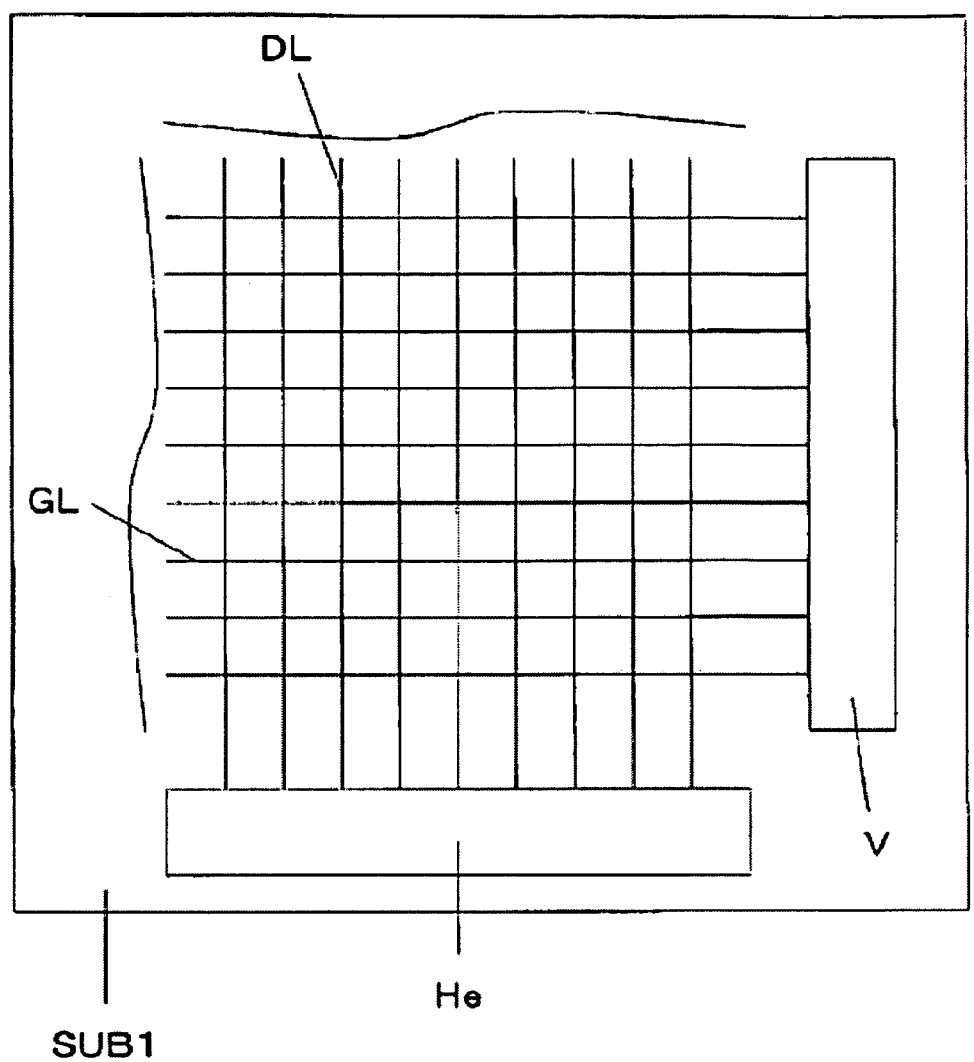
FIG. 20 is a view illustrating a structure in a case where a signal drive circuit is mounted on the substrate in the display device according to the present invention.

FIG. 20 is a plane view illustrating that a gate signal driving circuit V and a data signal driving circuit He are formed on the substrate SUB1 on which pixels are formed in matrix.

A scanning signal is supplied to the respective gate lines GL by the gate signal driving circuit V, and a video signal is supplied to the respective data lines DL by the data signal driving circuit He.

Note that, though not shown in FIG. 20, in the case of forming the retention capacitor RC, or the common line CL and the counter electrode CT on the substrate SUB1, the retention capacitor RC or the common line CL may be formed of a single film of molybdenum, chromium, tungsten, aluminum, copper, titanium, nickel, tantalum, silver, zinc, or other metal, a laminated film of those metals, an alloy film of those metals, or a laminated film of those films and a transparent oxide layer of ITO, ZnO, or the like.

The substrate SUB1 may be formed as a flexible substrate made of, for example, a synthetic resin or stainless in addition to the general glass substrate. This is because, since the materials that can be film-formed at low temperature are used, the synthetic resin can be used as a material of the substrate SUB1.

The above-mentioned display device and manufacturing method therefor according to the respective embodiments of the present invention can be applied not only to each liquid crystal display device of a transmission type, a reflection type, a half-transmission type, an IPS type, and an IPS-Pro type but also to other display devices such as organic EL display devices. This is because the display devices each provided with a thin film transistor for each pixel and performing an active matrix drive have the same problem to be solved.

The above-mentioned embodiments of the present invention may be used independently and in combination. This is because the effects of the respective embodiments can be achieved independently and synergistically.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising a pixel comprising:
a gate line, the gate line having a portion serving as a gate electrode of a thin film transistor;
a gate insulating film;
a substrate on which the gate line and the gate insulating film are sequentially formed;
a data line formed on the gate insulating film, the data line having a portion serving as a drain electrode of the thin film transistor;
a pixel electrode formed on the gate insulating film, the pixel electrode having a portion serving as a source electrode of the thin film transistor;
an oxide semiconductor layer formed on the gate insulating film over the gate electrode; and
a protective film formed on the data line, the pixel electrode, and the oxide semiconductor layer;
wherein the data line and the drain electrode is made of one continuous layer;
wherein the pixel electrode and the source electrode is made of one continuous layer; and
wherein the oxide semiconductor layer is directly connected to the drain electrode and the source electrode, and the data line and the pixel electrode comprise different conductive films.

2. A display device according to claim 1, wherein the oxide semiconductor layer is formed on the drain electrode and the source electrode.

3. A display device according to claim 1, wherein the oxide semiconductor layer is formed on one of the drain electrode and the source electrode, and another one of the drain electrode and the source electrode is formed on the oxide semiconductor layer.

4. A display device according to claim 1, wherein the drain electrode and the source electrode are formed on the oxide semiconductor layer.

5. A display device according to claim 1, wherein the data line comprises one of metal, a laminated film of metal and another conductive film, and a laminated film of metal and a semiconductor film, and the pixel electrode comprises a transparent conductive film.

6. A display device according to claim 1, wherein at least one of the drain electrode and the source electrode overlaps the gate electrode in plan view.

7. A display device according to claim 1, wherein a part of a region of the oxide semiconductor layer is modified to have low resistance, and at least one of the data line and the pixel electrode is connected to the part of the region modified to have low resistance.

8. A display device according to claim 1, further comprising a comb-shaped pixel electrode disposed to overlap a flat-plate like counter electrode via an insulating film,
wherein the flat-plate like counter electrode is supplied with a voltage signal sewing as a reference with respect to a video signal supplied to the comb-shaped pixel electrode via a common line.

9. A display device, comprising a pixel comprising:
a gate line, the gate line having a portion serving as a gate electrode of a thin film transistor;
a gate insulating film;
a substrate on which the gate line and the gate insulating film are sequentially formed;
a data line formed on the gate insulating film, the data line having a portion serving as a drain electrode of the thin film transistor;
an oxide semiconductor layer formed on the gate insulating film over the gate electrode;
a protective film formed on the gate insulating film, the data line, and the semiconductor layer; and
a pixel electrode formed on the protective film, the pixel electrode having a portion serving as a source electrode of the thin film transistor, the pixel electrode being connected to a source of the thin film transistor via a through hole formed in the protective film;
wherein the data line and the drain electrode is made of one continuous layer;
wherein the pixel electrode and the source electrode is made of one continuous layer; and
wherein the oxide semiconductor layer is directly connected to the drain electrode and the source electrode.

10. A display device according to claim 9, wherein the oxide semiconductor layer is formed on the drain electrode, and the protective film is formed on the drain electrode and the oxide semiconductor layer.

11. A display device according to claim 9, wherein the drain electrode is formed on the oxide semiconductor layer, and the protective film is formed on the oxide semiconductor layer and the drain electrode.

12. A display device according to claim 9, wherein:
the protective film is formed on the oxide semiconductor layer;
the data line is formed on the protective film, the data line being connected to a drain of the thin film transistor via another through hole formed in the protective film; and
the pixel electrode is formed on the protective film, the pixel electrode being connected to the source of the thin film transistor via the through hole formed in the protective film.

13. A display device according to claim 12, wherein the data line and the pixel electrode comprise the same conductive film.

14. A display device according to claim 9, wherein:
the data line comprises one of metal, a laminated film of metal and another conductive film, and a laminated film of metal and a semiconductor film; and
the pixel electrode comprises a transparent conductive film.

15. A display device according to claim 9, wherein the gate electrode and at least one of the drain electrode and the source electrode overlap with each other.

16. A display device according to claim 9, wherein a part of region of the oxide semiconductor layer is modified to have low resistance, and at least one of the data line and the pixel electrode is connected to the part of the region modified to have low resistance.

17. A display device according to claim 9, further comprising a comb-shaped pixel electrode disposed to overlap a flat-plate like counter electrode via an insulating film,
wherein the flat-plate like counter electrode is supplied with a voltage signal sewing as a reference with respect to a video signal supplied to the comb-shaped pixel electrode via a common line.

18. A display device, comprising a pixel comprising:
a gate line, the gate line having a portion serving as a gate electrode of a thin film transistor;
a gate insulating film;
a substrate on which the gate line and the gate insulating film are sequentially formed;
a data line formed on the gate insulating film, the data line having a portion serving as a drain electrode of the thin film transistor;
a pixel electrode formed on the gate insulating film the pixel electrode having a portion serving as a source electrode of the thin film transistor;
an oxide semiconductor layer formed on the gate insulating film over the gate electrode, the oxide semiconductor layer having a portion serving as a channel of the thin film transistor; and
a protective layer formed on the data line, the pixel electrode, and the semiconductor layer;
wherein at least one of (a) the data line, the drain electrode and the channel, and (b) the source electrode, the pixel electrode and the channel, are made of one continuous layer, the one continuous layer having a first portion to form the channel, and the one continuous layer having a second portion to form at least one of the data line and the pixel electrode, the first portion having a higher resistance than a resistance of the second portion.

19. A display device according to claim 18, wherein:
the data line comprises the part of the region of the oxide semiconductor layer modified to have low resistance, and the protective film is formed on the oxide semiconductor layer; and
the pixel electrode is formed on the protective film, the pixel electrode being connected to a source of the thin film transistor via a through hole formed in the protective film.

20. A display device according to claim 18, wherein:
the drain electrode is formed to overlap the gate electrode;
the oxide semiconductor layer is formed on the drain electrode; and
a part of a region of the oxide semiconductor layer is made to have low resistance to form the pixel electrode.

21. A display device according to claim 18, further comprising a comb-shaped pixel electrode disposed to overlap a flat-plate like counter electrode via an insulating film,
wherein the flat-plate like counter electrode is supplied with a voltage signal serving as a reference with respect to a video signal supplied to the comb-shaped pixel electrode via a common line.

* * * * *